United States Patent [19]

Miyagawa et al.

[11] Patent Number: 4,977,058
[45] Date of Patent: Dec. 11, 1990

[54] RECORDING MEDIUM COMPRISING A RECORDING LAYER CHANGING ITS TRANSFERABILITY WHEN PROVIDED WITH LIGHT AND HEAT

[75] Inventors: Masashi Miyagawa, Kawasaki; Masanori Takenouchi, Atsugi; Norio Ohkuma, Machida, all of Japan

[73] Assignee: Canon Kabushiki Kaisha, Tokyo, Japan

[21] Appl. No.: 128,465

[22] Filed: Dec. 2, 1987

[30] Foreign Application Priority Data

Dec. 2, 1986 [JP] Japan .................................. 61-285859

[51] Int. Cl.$^5$ .......................... G03C 1/68; G03C 1/72
[52] U.S. Cl. .................................... 430/138; 430/253; 430/281; 428/195; 428/402.2; 428/402.24; 428/913; 428/914
[58] Field of Search ................. 430/138, 253, 281, 41, 430/42, 46, 901, 284, 285; 428/195, 913, 914, 402.2, 402.24

[56] References Cited

U.S. PATENT DOCUMENTS

| 3,912,505 | 10/1975 | Goffe et al. | 430/41 |
| 4,054,682 | 10/1977 | Kuesters et al. | 430/907 |
| 4,081,282 | 3/1978 | Merrill et al. | 430/273 |
| 4,145,216 | 3/1979 | Merrill et al. | 430/258 |
| 4,310,615 | 1/1982 | Steelman et al. | 430/273 |
| 4,542,084 | 9/1985 | Watanabe et al. | 430/46 |
| 4,544,624 | 10/1985 | Nanpei et al. | 430/281 |
| 4,600,628 | 7/1986 | Ishii et al. | 428/216 |
| 4,632,899 | 12/1986 | Takeda | 430/281 |

FOREIGN PATENT DOCUMENTS 1077977 12/1957 Fed. Rep. of Germany .

Primary Examiner—Paul R. Michl
Assistant Examiner—Patrick Doody
Attorney, Agent, or Firm—Fitzpatrick, Cella, Harper & Scinto

[57] ABSTRACT

A transfer recording medium comprises a support and a transfer recording layer formed thereon capable of charging its transferability when provided with light energy and heat energy. The transfer recording layer comprises at least a colorant and a functional component sensitive to the provision of light energy and heat energy. The functional component comprises at least a photo-initiator and a polymerizing component of a monomer, oligomer or prepolymer having an unsaturated double bond. The polymerizing component has a melting point of 40°–150° C. Because of the inclusion of the polymerizing component which is solid at room temperature, the transfer recording layer has an excellent storability as well as an increased sensitivity contrast to illumination between under heating and under no heating.

8 Claims, 16 Drawing Sheets

SEPARATION-TRANSFER UNIT

TRANSFER IMAGE FORMATION UNIT

FIG. II

RECORDING MEDIUM COMPRISING A RECORDING LAYER CHANGING ITS TRANSFERABILITY WHEN PROVIDED WITH LIGHT AND HEAT

FIELD OF THE INVENTION AND RELATED ART

The present invention relates to a novel recording medium for use in a recording apparatus such as a printer, a copying machine and a facsimile recorder, particularly a recording medium for use in a recording system adapted to one-shot color recording.

In recent years, various recording methods and apparatus adapted for various information processing systems have been developed and adapted. Among these, the thermal transfer recording method has advantages that the apparatus employed is light in weight, compact, free of noise, excellent in operability and adapted to easy maintenance, and accordingly has been recently widely used. According to this method, plain paper can be used as a transfer-receiving medium.

However, the heat-sensitive transfer recording method of the prior art is not free from drawbacks. That is, according to the thermal transfer recording method of the prior art, the transfer recording performance, namely the printed letter quality, is remarkably influenced by the surface smoothness of the transfer-receiving medium, and therefore while good printing can be effected on a transfer-receiving medium having high smoothness, the printed letter quality will be markedly lowered in the case of a transfer-receiving medium with low smoothness. However, even when paper which is the most typical transfer-receiving medium may be used, a paper with high smoothness is rather special and ordinary papers have surface unevenness to various extents because they are formed through entanglement of fibers. As a result, according to the conventional thermal transfer recording method, the resulting printed image may not have a sharp edge or a part of the image may be lacked to lower the printed letter quality.

Further, in the conventional thermal transfer recording method, while the transfer of an ink layer to the transfer-receiving medium is caused by only the heat supplied from a thermal head, it is difficult even from a theoretical point of view to increase the heat supply from the thermal head, because it is required to cool the thermal head to a prescribed temperature in a limited short time and it is also required to prevent occurrence of thermal crosstalk between heat-generation segments or elements constituting the thermal head face. For this reason, high speed recording has been difficult to realize according to the conventional thermal transfer recording method.

Further, as heat conduction has a slow response speed compared with electricity or light, it has been generally difficult to control a heat pulse to such an extent as to be capable of reproducing a medium tone by the conventional recording system using a transfer medium, and also it has been impossible to effect a medium tone recording as the conventional thermal transfer ink layer lacks in a transfer function for gradational representation.

Further, in the conventional thermal transfer recording method, it has been only possible to obtain one color of image through one transfer operation, and accordingly, it has been required to repeat plural times of transfer to superpose colors in order to obtain a multi-color image. It is very difficult to exactly superpose images of different colors so that it has been difficult to obtain an image free of color deviation or aberration. Particularly, when one picture element is noted, superposition of colors has not been effected in such one picture element, and consequently, a multi-color image has been constituted by assembly or gathering of picture elements involving color deviation in the conventional thermal transfer recording method. For this reason, it has been impossible to obtain a clear multi-color image according to the conventional thermal transfer recording method.

Further, when it is intended to obtain a multi-color image by the conventional thermal transfer recording method, there have been accompanied with difficulties such as provision of plural thermal heads or complex movement involving reverse movement and stopping of a transfer-receiving medium leading to a large and complex apparatus or decrease in recording speed.

Further, there has been proposed a transfer imaging method for producing a multicolor image by using a color precursor (chromogenic material) and a developer (U.S. Pat. No. 4,399,209). More specifically, in this method, an imaging sheet comprising a substrate and a coating thereon comprising a chromogenic material and a radiation curable composition encapsulated in rupturable capsules, is provided; the coating is subjected to imagewise exposure with actinic radiation to cure the radiation curable composition and form a latent image; and the latent image is superposed onto a developer sheet to form a visible image on the developer sheet.

Further, U.S. Pat. No. 4,416,966 discloses a self-contained image-formation system wherein an imaging sheet comprising a developer and photosensitive microcapsules on the same surface of a support is used. The imaging sheet is exposed to mainly ultra-violet radiation modulated according to recording images, and then passed between pressure rollers where the micro-capsules are ruptured to liberate the enclosed material imagewise. At this time, the color former is migrated to contact the developer which is usually contained in a separate layer to cause a reaction to form a color image.

In both of the above two recording systems, only light energy is used for forming a latent image on a transfer recording method (image sheet), so that a recording medium highly sensitive to light or a light flux of a high energy is required in order to obtain a clear image at a high speed. A high sensitivity recording medium generally has a poor storage stability and is therefore not appropriate for easy handling. Further, it is difficult to obtain a high energy required for curing a radiation-curable composition at a high speed with a single kind of energy, particularly a light energy, whereby a large size of apparatus has been generally required.

Further, in the above recording system a color-forming reaction of a leuco dye is utilized so that the resultant recorded image is essentially inferior in stability.

Further, in order to facilitate the development through pressure-application, the enclosed material in the micro-capsules is required to be formed as a photosensitive composition which is liquid at room temperature and provides a poor storability. Moreover, the resultant image is accompanied with an odor of a monomer because a non-reacted material is ruptured, thus providing a practically undesirable characteristic.

In order to solve the above mentioned problems, our research group has proposed an image forming method (U.S. Patent Application Ser. No. 869,689, corr. to Japanese Patent Application No. 128814/1986).

These applications basically disclose an image forming method, comprising: providing a transfer recording medium comprising a transfer recording layer, the transfer recording layer being capable of causing an irreversible change in transfer characteristic thereof when provided with plural kinds of energies; imparting the plural kinds of energies to the transfer recording layer under such a condition that at least one of the plural kinds of energies corresponds to a recording information signal, thereby to form a transferable portion in the transfer recording layer; and transferring the transferable portion of the transfer recording layer to a transfer-receiving medium, thereby to leave an image corresponding to the transferable portion on the transfer-receiving medium.

Our research group has further proposed a recording method having improved the above image-forming method in respect of the fixability of the recorded image (U.S. Patent Appln. Ser. No. 927,876) and a recording method wherein a vaporizable dye is used in the above image-forming method (U.S. Patent Appln. Ser. No. 70,194).

SUMMARY OF THE INVENTION

A principal object of the present invention is to provide a recording medium which is suitably used in the above-mentioned series of image-forming methods proposed by out research group which have solved the problems of the conventional methods as mentioned above, i.e., the methods which can provide transferred images of a high quality, are capable of effecting high-speed recording and medium tone recording and can provide clear multi-color images free of color deviation without accompanying complicated movement of a transfer-receiving medium.

A more specific object of the present invention is to provide a recording medium which is suitably used in the above-mentioned image-forming methods and which has an excellent storage stability and is capable of providing clear recorded images at a high contrast.

According to the present invention, there is provided a transfer recording medium comprising a support and a transfer recording layer formed thereon capable of changing its transferability when provided with light energy and heat energy;

wherein the transfer recording layer comprises at least a colorant and a functional component sensitive to the provision of light energy and heat energy; the functional component comprises at least a photo-initiator and a polymerizing component of a monomer, oligomer or prepolymer having an unsaturated double bond; and the polymerizing component has a melting point of 40° –150° C. Herein, the term "polymerizing" is intended to also cover "crosslinking".

These and other objects, features and advantages of the present invention will become more apparent upon a consideration of the following description of the preferred embodiments of the present invention taken in conjunction with the accompanying drawings, wherein like parts are denoted by like reference numerals. "Parts" or "%" used hereinafter with reference to a composition are by weight unless otherwise noted specifically.

DETAILED DESCRIPTION OF THE INVENTION

The transfer recording medium according to the present invention comprises a support and a transfer recording layer disposed on the support. The transfer recording layer contains a functional component sensitive to provision of light energy and heat energy and is composed to change its transfer characteristic when provided with light energy and heat energy. The transfer recording layer may be a continuous uniform layer or may be a distributed layer of image forming elements. The image forming elements can be in the form of microcapsules.

In order to effect recording, light and heat energies are supplied to the transfer recording layer so that at least one of them corresponds to given recording information to provide portions having different transfer characteristics, whereby a transferable image based on a difference in transfer characteristic is formed and transferred to a transfer receiving medium.

The physical property controlling the transfer characteristic may be determined depending on a particular type of transfer recording medium used. For example, with respect to a transfer recording medium used in a transfer mode wherein transfer of an image is effected through heat-fusion of the image, the physical property may be a melting temperature, a softening temperature, a glass transition temperature, etc. With respect to a transfer recording medium used in a transfer mode wherein transfer of image is effected by making a transferable image viscous or penetrable into a transferreceiving medium, the physical property may be a viscosity at the relevant temperature.

Figure 1A:
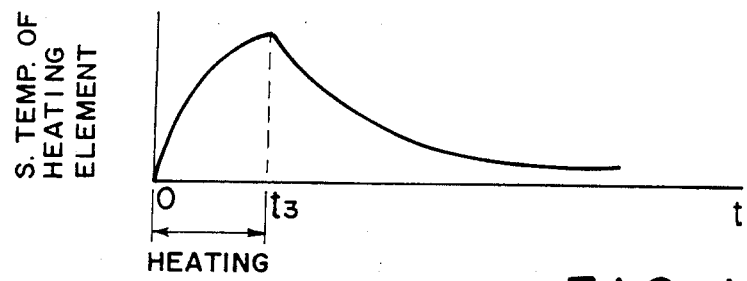
FIGS. 1A–1B show charges of several parameters with elapse of time involved in an image forming step using a transfer recording medium according to the present invention.
Figure 1B:
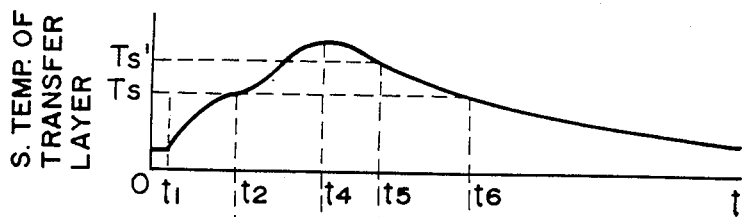

An image forming method suitable for using the recording medium of the present invention for image formation is explained with reference to FIGS. 1A-1D, wherein the abscissas are indicated on a common scale of time. The transfer recording layer contains a photoinitiator, a polymerizing component, etc., which will be explained hereinafter. FIG. 1A shows a surface temperature change of a heating element when a heating means such as a thermal head is energized for heat generation for a period of 0- $t_3$ and subjected to temperature decrease thereafter. A transfer recording medium contacting the heating means under pressure causes a temperature change as shown in FIG. 1B corresponding to the temperature change of the heating means. More specifically, it starts to cause a temperature rise after a time delay of $t_1$ and similarly reaches the maximum temperature at time $t_4$ after time $t_3$, then followed by temperature decrease. The transfer recording layer has a softening temperature Ts and the viscosity thereof decreases in a temperature region above Ts. The change in viscosity is shown by a curve A in FIG. 1C. Thus, after the temperature reaches Ts at time $t_2$ and until it reaches the maximum temperature at time $t_4$, the viscosity continually decreases, while the viscosity again increases thereafter along with temperature decrease to show an abrupt increase in viscosity until time $t_6$ when the temperature decreases to Ts. In this case, the transfer recording layer has not been basically subjected to any material change and shows a decrease in viscosity in the manner as described above when it is heated above Ts in a subsequent transfer step.

Accordingly, if the transfer recording layer is caused to contact a transfer-receiving medium under pressure and subjected to heating required for transfer, e.g., to a temperature above Ts, the transfer recording layer is transferred in the same transfer mechanism as involved in the conventional thermal transfer recording. In this invention, however, when the transfer recording layer is illuminated or exposed to light from $t_2$ in parallel with heating as shown in FIG. 1D, and the temperature is sufficiently increased, the transfer recording layer softens and the reaction initiator, is actuated to provide a large reaction velocity, and a composition comprising at least one of a monomer, oligomer or prepolymer having an ethylenically unsaturated double bond rapidly causes hardening because of increased probability of polymerization.

The heated temperature may preferably be set to 70° C. or more, particularly 80° C. or more in order to provide a good result through rapid and stable reaction of changing the transfer characteristic.

Figure 1C:
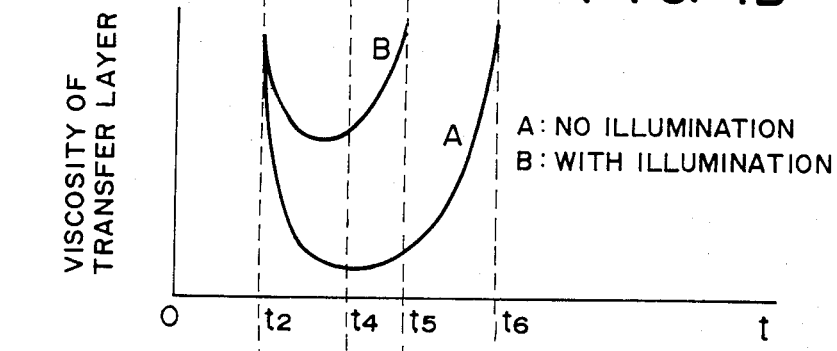
Figure 1D:
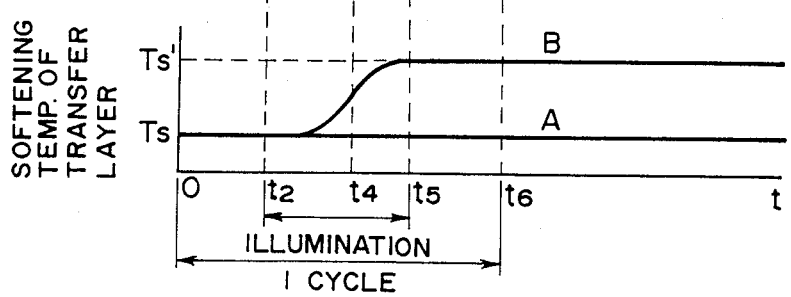

If heating and illumination are simultaneously carried out in this way, the transfer recording layer shows a viscosity change as represented by a curve B in FIG. 1C. Then, along with further progress of curing, the softening temperature is raised from Ts to Ts' at time $t_2$ when the curing is completed. Corresponding to this, the transfer recording layer is caused to have a different transfer initiation temperature, i.e., a temperature at which it starts to be transferred, from a certain temperature Ta to Ta'. The change in softening temperature as described above of the transfer recording layer is illustrated in FIG. 1D. As a result, the transfer recording layer has a portion having a transfer initiation temperature Ta' and also a portion retaining a transfer initiation temperature Ta which behave differently in a subsequent transfer step. Now, when the transfer recording layer is heated to a temperature Tr satisfying Ta<Tr<Ta', the portion having a transfer initiation temperature Ta preferentially causes an abrupt decrease in viscosity to be selectively transferred to a transfer-receiving medium. In this instance, Ta'- Ta should preferably be about 20° C. or more, particularly 40° C or more, while it somewhat depends on temperature stabilization accuracy during the transfer step. The value also holds true with a case of Ts>Ts'. In this way, a transferable image may be formed by controlling heating or non-heating in combination with simultaneous illumination, corresponding to an image signal.

The physical property controlling the transfer characteristic of the transfer recording layer may be a melting point or glass transition point in addition to the above-mentioned softening temperature. In any case, a transferable image is formed in the transfer recording layer through utilization of an irreversible change in physical property such as melting point and glass transition temperature. The softening temperature, melting temperature and glass transition temperature change with similar tendencies, so that the above explanation with respect to utilization of the softening temperature may also be an explanation with respect to utilization of a melting point or glass transition point.

As will be understood from the above description, the degree of irreversible change in transfer characteristic required for the transfer recording layer in the present invention is conveniently represented by a change in transfer initiation temperature. Herein, the transfer initiation temperature mentioned herein is a value measured by the following method.

A 6 $\mu$-thick transfer recording layer formed on a 6 $\mu$-thick polyethylene terephthalate (PET) film is caused to contact 0.2 mm-thick wood-free paper as a transfer-receiving medium having a surface smoothness (Bekk smoothness) of 50-200 seconds. The resultant laminate of the transfer recording medium and the paper is passed at a rate of 2.5 mm/sec between a pair of rollers as follows. The first roller is a hollow cylindrical iron roller of 40 mm diameter in which a 300 W-halogen lamp heater is stored and is disposed on the side of the transfer recording medium. The second roller disposed on the side of the paper comprises a similar iron roller of 40 mm diameter coated with a 0.5 mm-thick fluorine rubber layer. The two rollers are operated to exert a linear pressure of 4 kg/cm. In the measurement, the surface temperature of the first roller is measured by a temperature sensor, e.g., a thermistor, while controlling the halogen lamp heater to provide a prescribed temperature. At a time of 4 seconds after the laminate is passed through the two rollers, the transfer recording medium is peeled off the paper moved horizontally at a peeling angle of about 90° and at a rate equal to the conveying speed of the rollers, so that it is observed whether the transfer recording layer has been transferred onto the paper. The operation is continued while gradually raising the surface temperature of the first roller (at a rate of 10° C./min or less), and the minimum temperature at which the transfer starts to occur effectively (as identified by saturation of a transferred image density) is identified as the transfer initiation temperature of the transfer recording medium or the transfer recording layer.

In the above, the change in transfer characteristic has been exaplined as it is represented by a charge in glass transition temperature Tg, softening temperature Ts or melting temperature Tm. However, the recording medium according to the present invention may be sufficient if it changes its viscous state or penetration characteristic to the transfer-receiving medium in order to provide a recorded image through the following transfer step, so that it may be applicable even if a clear change in Tg, Ts or Tm as described above does not occur.

The combination of plural kinds of energies for producing a transferable image may suitably be light and heat or an energy convertible into heat selected from electric, ultrasonic and pressure in view of energy efficiency.

Next, formation of a multi-color image by the above recording method will be explained.

FIGS. 2A–2D are schematic partial sectional views showing a relationship between a transfer recording medium and a thermal head according to the present invention. In this embodiment, a heat energy modulated according to a recording signal is applied in combination with a light energy selected depending on the color of an image forming element of which the transfer characteristic is intended to be changed. Herein, "modulation" is an operation of changing a position to which the energy is applied corresponding to a given image signal, and "in combination" covers a case where the light energy and the heat energy are applied simultaneously as well as a case where the light energy and the heat energy are applied separately.

A transfer recording medium 1 shown in FIGS. 2A–2D comprises a transfer recording layer 1a disposed on a base film 1b. The transfer recording layer 1a is formed as a layer of distributed particulate image forming elements. Respective image forming elements show different color tones. In the embodiment shown in FIGS. 2A–2D, for example, each image forming element contains any one colorant selected from magenta (M), cyan (C) and yellow (Y). The colorants to be contained in the image forming elements, however, are not restricted to magenta, cyan and yellow, but may be colorants of any color depending on an intended use. Each image forming element contains in addition to a colorant, a functional or sensitive component, of which the transfer characteristic changes when light and heat energies are applied thereto. The image forming elements may be formed on the substrate 1b together with a binder or by heat-melting the above components.

The functional component in the image forming elements has a wavelength dependency depending on the colorant contained. More specifically, an image forming element (M) containing a magenta colorant causes polymerization to be hardened or cured when a heat flux and a light beam with a wavelength (M) are applied thereto. Similarly, an image forming element (C) containing a cyan colorant and an image forming element (Y) containing a yellow colorant respectively cause polymerization to be hardened when a heat and a light beam with a wavelength $\lambda(C)$ and heat, and a light beam with a wavelength $\lambda(Y)$ and heat, respectively, are applied thereto. A cured or hardened image forming element does not cause decrease in viscosity even when heated in a subsequent transfer step, so that it is not transferred to a transferreceiving medium. The heat and light are applied corresponding to an information signal to be recorded.

In this way, the transfer recording medium 1 is superposed on a thermal head 14, and light is illuminated so as to cover the entire heat generation region of the thermal head 14. The wavelengths of the illumination light are so selected sequentially as to react on image forming elements (M), (C) and (Y) to be illuminated. For example, if image forming elements (M), (C) and (Y) to be illuminated are colored in any one of magenta, cyan and yellow, light beams having a wavelength $\lambda(M)$, $\lambda(C)$ and $\lambda(Y)$, respectively, are successively irradiated.

More specifically, while the transfer recording medium is illuminated with a light beam having a wavelength $\lambda(M)$, resistance heating elements 14b and 14c, for example, of the thermal head are caused to generate heat. As a result, among the image forming elements (M) containing a magenta colorant, those applied with the heat and the light beam with a wavelength $\lambda(M)$ are cured as shown by hatching in FIG. 2A (in FIG. 2B, et seq., the cured elements are also indicated by hatching).

Figure 2A:
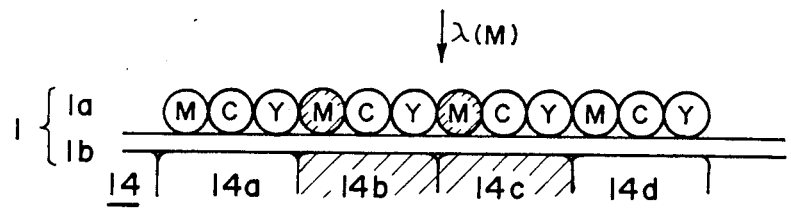
FIGS. 2A–2D are schematic partial sectional views showing a relationship between a transfer recording medium and a thermal head involved in a multi-color transfer recording mode using a transfer recording medium according to the present invention.
Figure 2B:
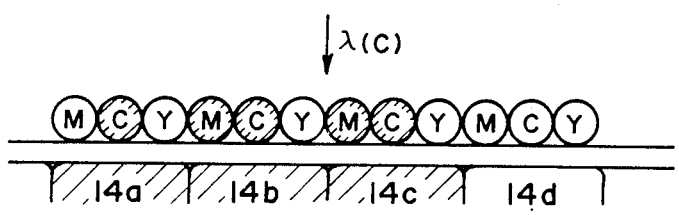
Figure 2C:
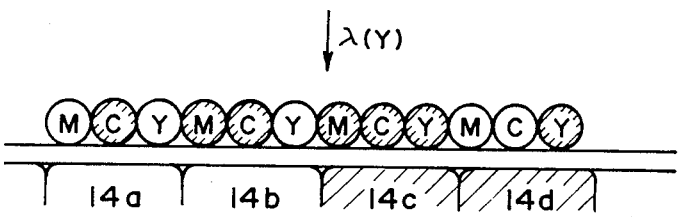
Figure 2D:
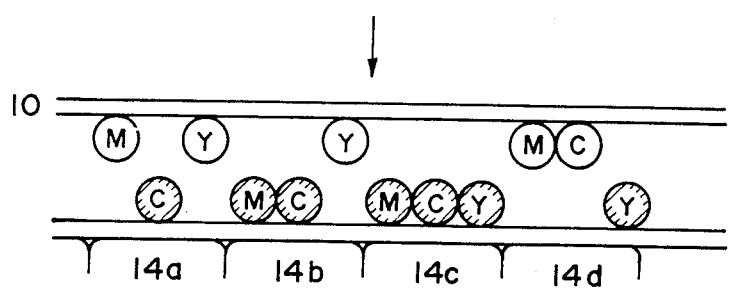

Then, as shown in FIG. 2B, while the transfer recording layer 1a is illuminated with a light beam with a wavelength $\lambda(C)$, resistance heating elements 14a, 14b and 14c are caused to generate heat, whereby among the image forming elements containing a cyan colorant, those applied with the heat and the light beam with a wavelength $\lambda(C)$ are cured. Further, as shown in FIG. 3C while the light flux with wavelength $\lambda(Y)$ is provided, resistance heating elements 14c and 14d are caused to generate heat, whereby among the image forming elements (Y), those applied with the heat and the light beam with a wavelength (Y) are cured to finally leave a transferable image formed of non-cured image forming elements in the transfer recording layer 1a. The transferable image is then transferred to a transfer-receiving medium 10 in a subsequent transfer step as shown in FIG. 2D.

In the transfer step, the transfer recording medium on which the transferable image has been formed is caused to contact the transfer-receiving medium 10 through the faces and heat is applied from the transfer recording medium side or the transfer-receiving medium 10 side, whereby the transferable image is selectively transferred to the transfer-receiving medium 10 to form a visible image thereon. Accordingly, the heating temperature in the transfer step is so determined in connection with the change in transfer characteristics that the transferable image is selectively transferred. Further, in order to effectively carry out the transfer, it is also effective to apply a pressure simultaneously. The pressurization is particularly effective when a transfer-receiving medium having a low surface smoothness is used. Further, where the physical property controlling a transfer characteristic is a viscosity at room temperature, the pressurization alone is sufficient to effect the transfer.

The heating in the transfer step is suitable for producing a durable multi-color image with a stability and an excellent storability.

In the above embodiment explained with reference to FIGS. 2A to 2D, the entire area of the thermal head 14 is illuminated with light while resistance heating elements of the thermal head 14 are selectively energized. On the contrary, while a certain area of the transfer recording medium are uniformly heated, e.g., by energizing all the resistance heating elements of the thermal head 14 shown in FIGS. 2A–2D, light illumination may be effected selectively or imagewise to form a similar multi-color image. More specifically, light energy having a wavelength modulated according to a recording signal and selected depending on the color of an image forming element of which the transfer characteristic is intended to be changed, is imparted along with heat energy.

Figure 3A:
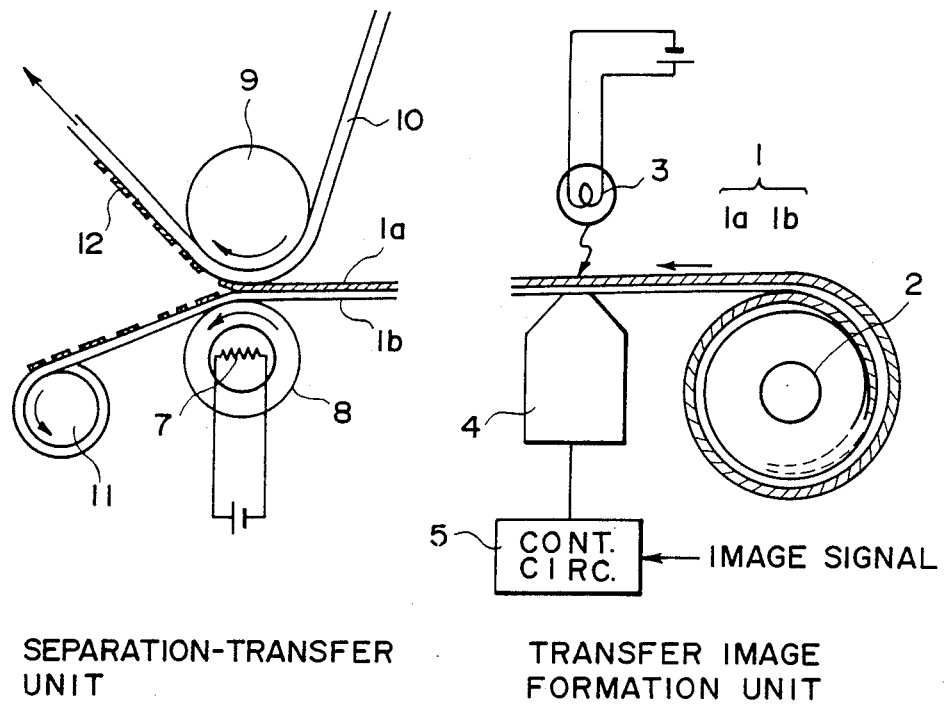
FIGS. 3A and 3B are schematic views showing an embodiment of apparatus for using a transfer recording medium of the invention.
Figure 7:
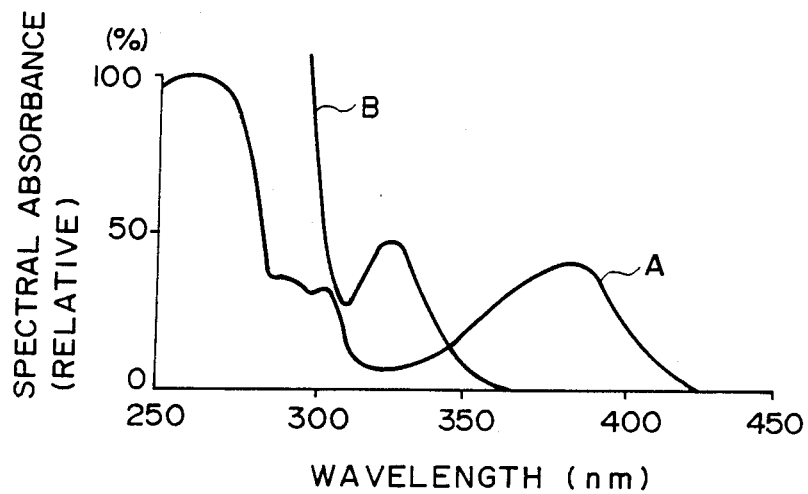
FIG. 7 shows the spectral absorption characteristics of photo-initiators contained in two kinds of image forming elements in Example 7.

FIG. 3A illustrates an example of apparatus for practicing the image-forming process suitable for using the transfer recording medium of the present invention. More specifically, the apparatus shown in FIG. 3A is used for practicing a mode of the image-forming method wherein a plurality of heating elements in a single heating means are selectively energized corresponding to given image signals and light rays having wavelength different dependent on colors of images to be recorded are incident to at least portions of the heating elements thus energized. Referring to FIG. 7, a transfer recording medium 1 according to the present invention comprises a film substrate 1b and a transfer recording layer 1a formed thereon. The transfer recording medium 1 is wound about a feed roller 2. An illumination means 3 disposed to illuminate the transfer recording medium 1 with light may be a low-pressure mercury lamp, a high-pressure mercury lamp, a metal halide lamp, a fluorescent lamp, a xenone lamp, etc. Opposite to the illumination means 3 with respect to the transfer recording medium 1 is disposed a heating means 4 such as a thermal head which is controlled by a control circuit 5 to generate heat pulses. Instead of an ordinary thermal head, a current-conduction type self-heat generative transfer recording medium which generaltes heat due to a current passing therethrough may also be used. In this case, the heating means 4 is composed as a current head which generates electric pulses passing through the medium. The heating means 4 is provided with a plurality of heating elements (equal to resistance heating elements 14a, 14b, . . . shown in FIGS. 2A–2D when the heating means is a thermal head, and unit electrodes when the heating means is a current head). The heating elements may be arranged in a single row, in matrix or in a plurality of rows. Further, the heat elements may respectively be discrete ones, or may be parts of a continuous bar-shaped resistance heating member provided with discrete electrodes.

The apparatus further includes transfer means comprising a heat roller 8 provided with a heater 7 inside thereof and a pinch roller 9 disposed opposite to the heat roller 8 so as to pinch a laminate of the transfer recording medium 1 and a transfer-receiving medium 10 such as plain paper or an OHP sheet (overhead projection transparency), and a windup roller 11 about which the transfer medium 1 after the transfer operation is wound up. The recorded image 12 corresponding to the transferable image is transferred from the transfer medium 1 and formed on the medium 10.

The transfer medium 1 sent from the supply roller 2 is applied with heat pulses by the thermal head 4 based on image signals supplied to the control circuit 5. Simultaneously with the application of heat pulses to the transfer medium 1, different wavelengths of light are successively issued from the lamp 3 in synchronism with the heat pulses based on the (color) image signals. The principle of transferable image formation is the same as explained with reference to FIGS. 2A–2D. The lamp 3 in the figure is schematically depicted and may be composed of a plurality of lamps issuing different wavelengths of light. More specifically, if one spectral region of light is supplied from one lamp, lamps are required in a number equal to that of the colors of the image forming elements.

A transferable image portion is formed in the transfer recording layer 1a by means of the thermal head 4 and the lamp 3 and is transferred to the transfer-receiving medium 10 when passed through the heat roller 8 and the pinch roller 9.

In this case, basically a single selective heating means such as a thermal head is controlled based on image signals, so that the control circuit can be made a simple one. As a result, it is easy to realize a small-sized highly reliable apparatus and also stable image formation.

Further, it is also possible to control both the heating and illumination based on image signals. For example, this may be realized if heat is applied in the manner as described above with reference to FIGS. 2A–2D while light is thrown upon positions corresponding to the energized resistance heating elements. In other words, light is uniformly illuminated in the embodiment shown in FIGS. 2A–2D, whereas light is controlled so as to be coincidently thrown upon the heat-generated parts of the thermal head in the case where both heating and illumination are controlled. In this manner, in a case where image forming elements having sensitivities to particular wavelengths, wavelengths of light beams are successively changed, whereas in a case where image forming elements having sensitivities to particular temperatures, the image forming elements are heated to different temperatures depending on their colors.

The mode wherein both heating and illumination are controlled as described above is advantageous in order to obtain a large contrast or change in transfer characteristic of a latent image, whereby a sharp image can be obtained easily. Further, even if one type of sensitivity characteristic or controllability is deteriorated, an accompanying ill effect may be half reduced, so that a reliable apparatus can be easily obtained.

Formation of a multi-color image has been explained in the above, but a monocolor image can also be obtained by the apparatus shown in FIG. 3A, if a single colorant is used in the transfer recording layer. This is also true with the apparatus which will be explained hereinafter.

The transfer recording medium used in the above recording method is required to satisfy the following properties.

(a) The portion of the transfer recording layer not supplied with heat energy is placed at a temperature in the range of from room temperature to a temperature in the apparatus. The transfer recording medium is required not to change its transfer characteristic even when illuminated in this temperature range.

(b) The heating temperature in the transferable image-formation step is assumed to be generally 30° –150° C. while it is determined by factors, such as the heating characteristic of a thermal head or a current-conduction head and the heat resistance of the support film carrying the transfer recording layer. Accordingly, the transfer recording layer is desired to change its transfer characteristic sharply when illuminated in this temperature range.

(c) The heating temperature in the transferable image-formation step changes delicately because of change in environmental temperature and heat-accumulation of the thermal head. Accordingly, the transfer recording layer has a minimum temperature dependency of its transferability in a delicate heating temperature change.

The above recording system is based on a negative recording system, so that un-hardened or un-cured elements are transferred to form a recorded image. Accordingly, it is preferred that the transfer recording layer comprises a material which is solid and non-tacky at room temperature. In the recording system, a binary (or white and black) image is formed by a change in transfer temperature of the transfer recording layer due to a difference in reaction speed between under heating and under no heating at the same level of illumination. For this reason, a good contrast is given if the transfer recording layer contains at least one substance which causes a thermal phase change in the temperature range given by heating and no heating. Specific examples of the thermal phase change include the melting of the polymerizing component such as a monomer, oligomer or prepolymer having an unsaturated double bond (ethylenic unsaturation), the melting of the photo-initiator and the melting or glass transition of a binder component, if any. As a result of our study, it has been found that an improved contrast is obtained if the melting point of the polymerizing component is set to a temperature in the neighborhood of the heating temperature in the transferable image-formation step.

Further, the polymerizing component constituting the transfer recording layer has an ethylenic unsaturation, and if the reactivity thereof is increased in order to provide a high sensitivity, there is accompanied a serious problem that the storage stability is remarkably lowered correspondingly. According to our study, it has been found that, if a polymerizing component having a melting point of 40° C. or higher, particularly 60° C. or higher, is used, it assumes a solid state at room temperature where the reaction probability is extremely suppressed to provide a very good storage stability, even if the double bond thereof shows a high reactivity.

On the other hand, if the polymerizing component has a melting temperature above 150° C., a part of the component polymerizes as soon as it is melted, so that it is difficult to apply such a polymerizing component to the above recording system. Even if the component does not polymerize, a melting point of above 150° C. leads to a necessity of imparting a large energy in the transferable image-formation step or in the transfer step, thus being practically undesirable. As a result, the polymerizing component used in the present invention may preferably have a melting temperature of 150° C. or below, particularly 130° C. or below.

Conventionally known monomers or oligomers generally assume a liquid phase at room temperature. As a result of our research for obtaining a polymerizing component showing a melting point of 40°-150° C., however, such a polymerizing component may suitably be obtained as a class of compounds having a group susceptible of hydrogen bond such as urethane bond or ester bond and also a cyclic scheleton such as benzene ring, cyclohexane ring or isocyanuric ring. In view of sensitivity, one having a cyclohexane ring or isocyanuric ring is particularly effective. This is presumably because a polymerizing component having a benzene ring receives an energy transfer from a photo-initiator when the photo-initiator as a radical source illuminated to be excited and before it generates radicals, thus lowering the radical generation efficiency of the photo-initiator.

Examples of the polymerizing component inclusive of monomers, oligomers or prepolymers may include: those containing a benzene ring, inclusive of urethane acrylates obtained by reaction of diisocyanate such as 4,4-diphenylmethane diisocyanate and 1,4-phenylene diisocyanate with acrylic compounds such as 2-hydroxyethyl acrylate, 2-hydroxyethyl methacrylate and 2-hydroxypropyl acrylate; reaction product of 4,4'-dihydroxybiphenyl with acrylic acid; and epoxy (meth)acrylates obtained through reaction of bisphenol A-type epoxy resin with acrylic acid or methacrylic acid;

those containing an isocyanuric ring, inclusive of tris(2-methacryloxy)isocyanurate, trimethacryl isocyanurates, and isocyanuric compounds obtained through addition of isocyanates having different unsaturated double bonds; and those containing a cyclohexane ring, inclusive of urethane acrylates obtained through reaction of diisocyanates, such as 4,4'-dicyclohexylmethane diisocyanates and 1,4-cyclohexylene diisocyanate with acrylic compounds, such as 2-hydroxyethyl acrylate, 2-hydroxyethyl methacrylate, and 2-hydroxypropyl acrylate; and acrylic esters, obtained through reaction of diols such as 4,4-dihydroxycyclohexane and 1,4-cyclohexanedimethanol with acrylic acid or methacrylic acid.

These compounds can be in the form of oligomers or prepolymers.

Hereinbelow, some synthesis examples of polymerizing components suitably used in the present invention are raised.

SYNTHESIS EXAMPLE 1

[Epoxy acrylate synthesized from bisphenol A-type resin and 2-hydroxy acrylate]

Into 100 ml of tetrahydrofuran (THF), 20 g of bisphenol A-type epoxy resin, 30 g of 2-hydroxyethyl acrylate, 0.5 g of 4-methoxy-quinone (polymerization inhibitor) and 0.5 g of phenyltrimethylammonium chloride were added, and the mixture was reacted for 6 hours at 80° C. Thereafter, the reaction liquid was poured in 1 l of 5N-NaOH aqueous solution, and the mixture was vigorously stirred, followed by recovery of the reaction product. The reaction product was again dissolved in 20 g of tetrahydrofuran and reprecipitated by adding 300 ml of n-hexane, followed by washing. The thus synthesized polymerizing prepolymer was dried at 40° C. for 2 hours and then used for further experiment.

The melting point of the prepolymer was measured to be about 60° C. as a result of measurement by means of DSC-7 (Perkin Elmer Co.) wherein about 800 mg of the sample was subjected to temperature raising at a rate of 10° C./min. Further, as a result of measurement by using a micro-melting point tester, a melting point of 62°-65° C. was measured.

Figure 9:
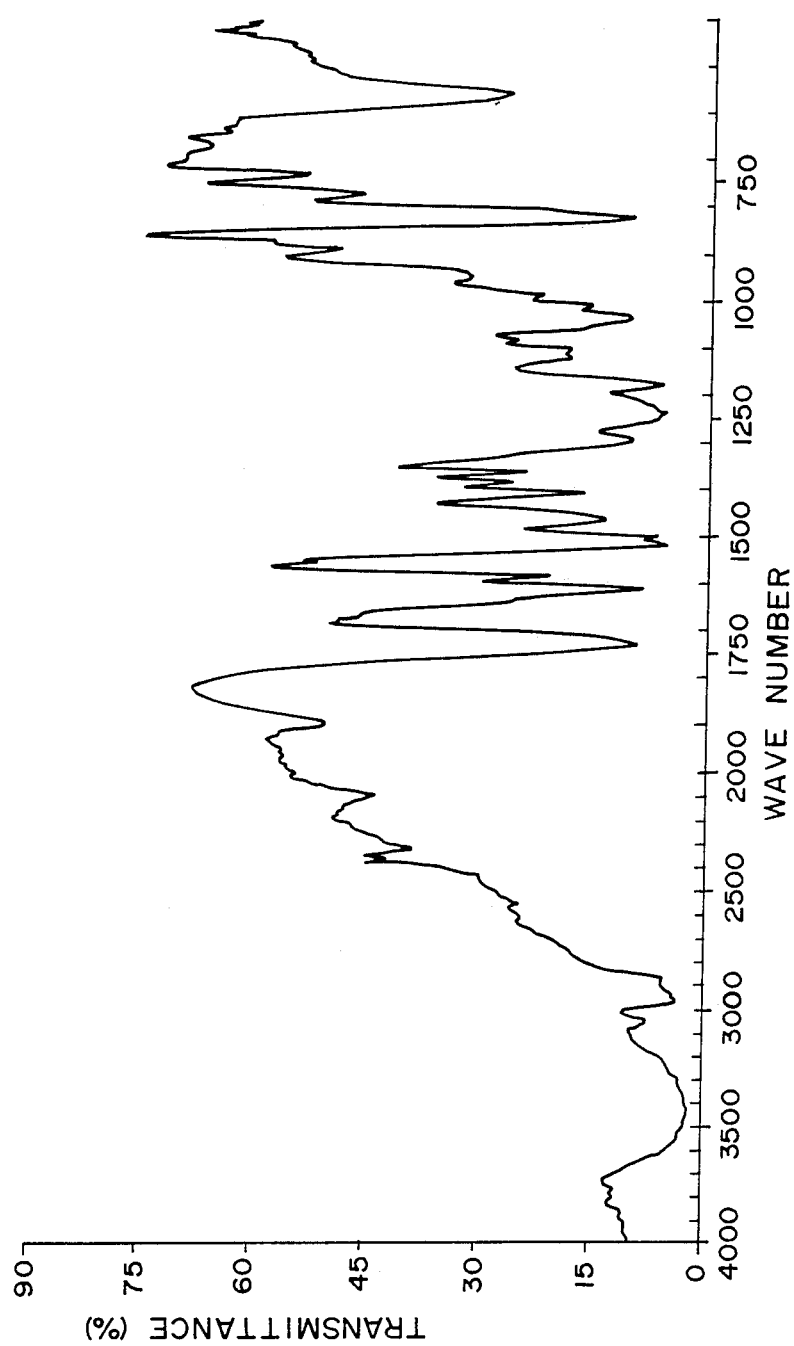
FIGS. 9 to 18 are infrared absorption charts of monomers or oligomers used in the present invention.
Figure 10:
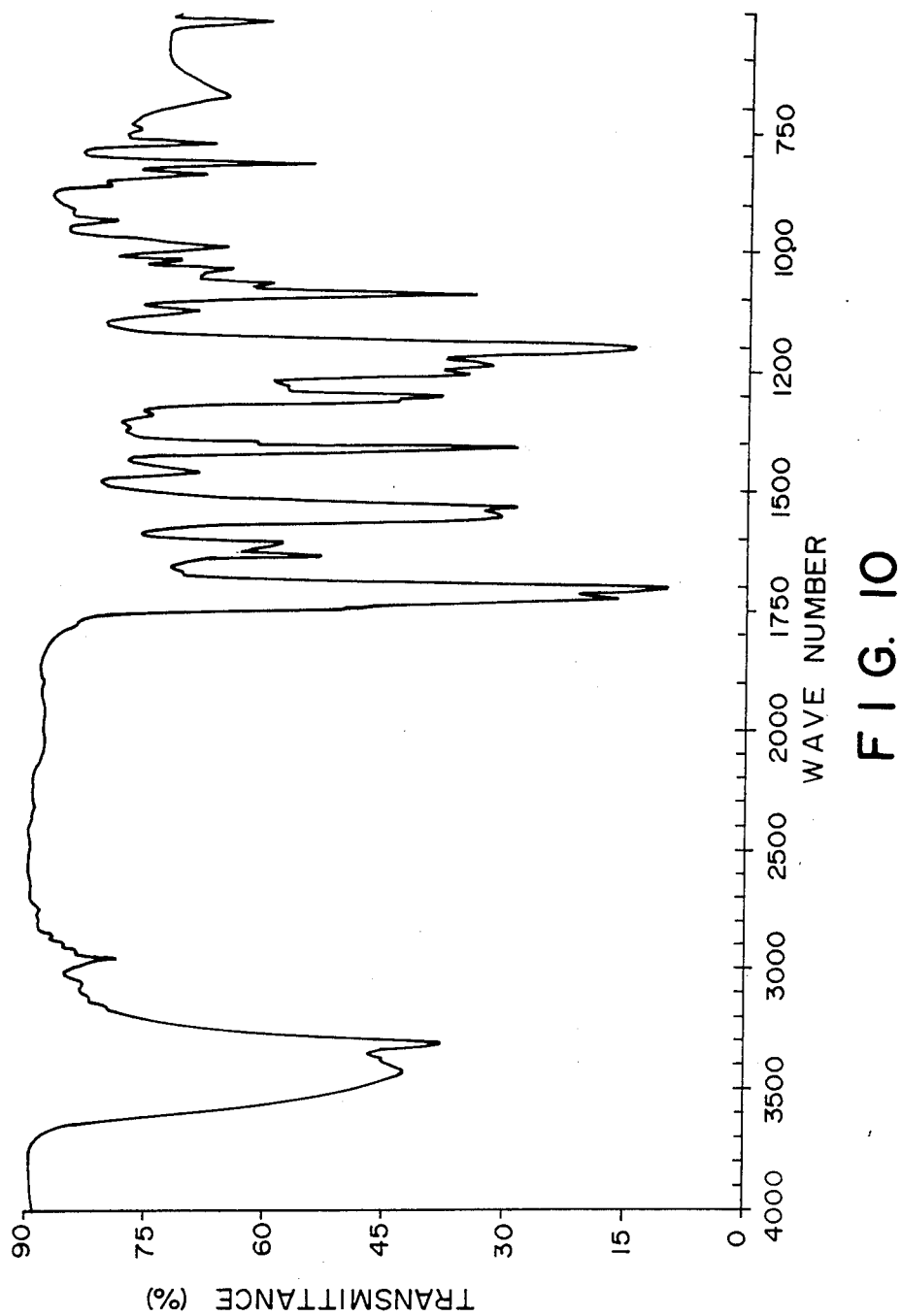

The IR (infrared absorption) chart of the prepolymer is reproduced as FIG. 9.

SYNTHESIS EXAMPLE 2

[Urethane acrylate (1) synthesized from 1,4-phenylene diisocyanate and 2-hydroxyethyl acrylate]

160 g (1.0 mol) of 1,4-phenylene diisocyanate was dissolved in about 500 ml of THF, and 0.05 g of dibutyltin dilaurate was added thereto, followed by stirring at about 60° C. Then, a solution of 0.05 g of hydroquinone monomethyl ether and 243.9 g (2.1 mol) of 2-hydroxyethyl acrylate in about 100 ml of THF was added dropwise thereto. After the addition, the mixture was held at 60° C. and reacted for about 6 hours. Then, a large amount of water was added to the reaction liquid, and the resultant precipitate was filtered out and dried to be obtain urethane acrylate (1) represented by the following formula:

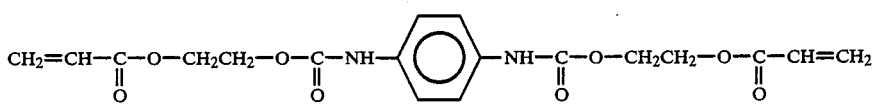

Figure 11:
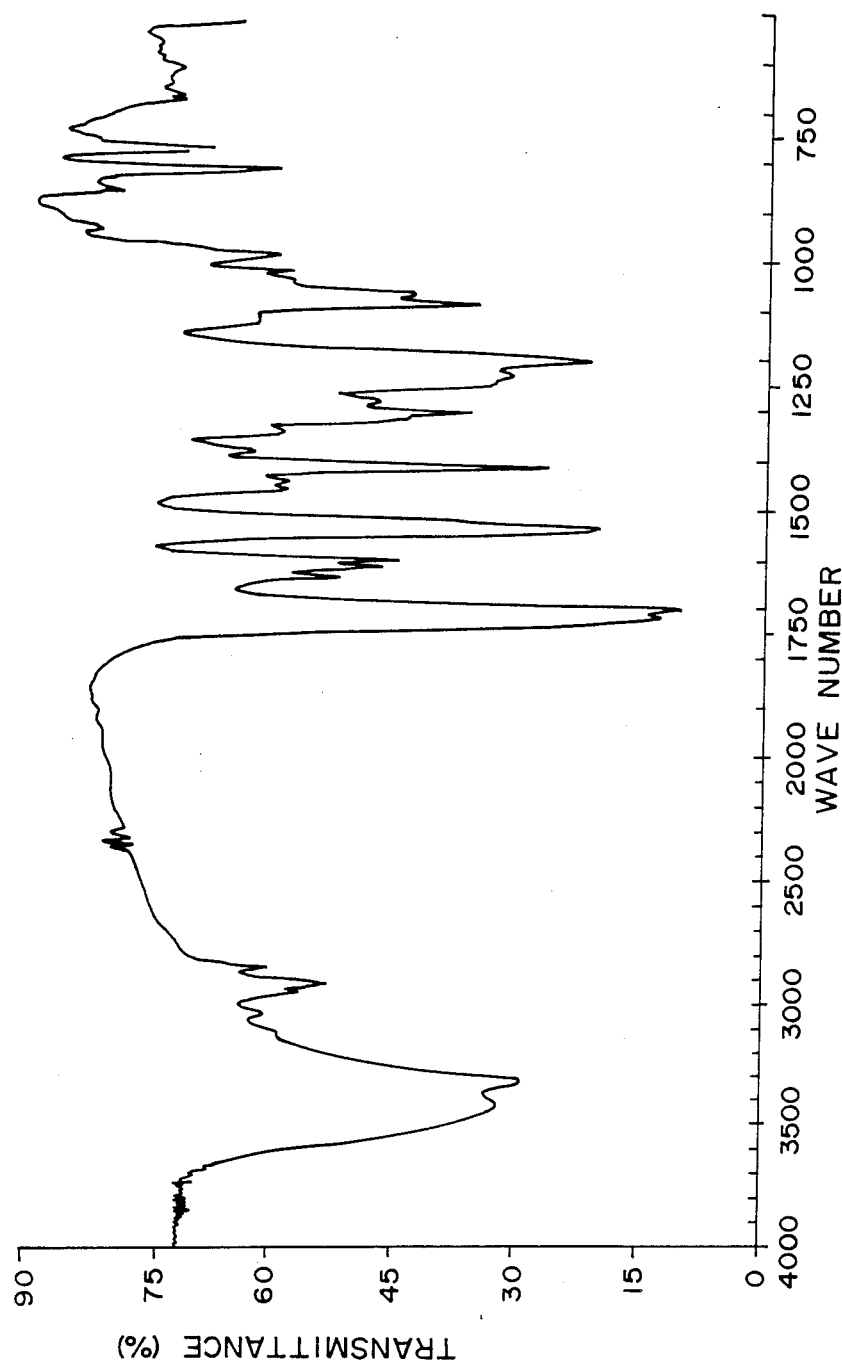

M.P. (melting point): 120°–125° C. (by a micromelting point tester. The same as hereinafter unless otherwise noted specifically). The IR chart is reproduced as FIG. 11.

SYNTHESIS EXAMPLE 3

[Urethane acrylate (2) synthesized from 4,4-diphenylmethane diisocyanate and 2-hydroxyethyl acrylate]

In a similar manner as in Synthesis Example 2, urethane acrylate (2) represented by the following formula was obtained.

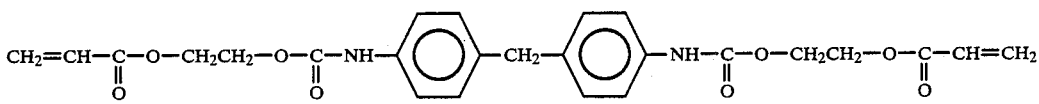

M.P.: 88°–90° C. The IR chart is reproduced as FIG. 11.

SYNTHESIS EXAMPLE 4

Urethane acrylate (3) synthesized from tolylene diisocyanate, 2-hydroxyethyl acrylate and trimethylolpropane]

174.2 g (1 mol) of tolylene diisocyanate was dissolved in about 500 ml of THF, and 0.05 g of dibutyltin laurate was added thereto, followed by stirring at 60° C. Then, a solution of 41.0 g of (0.306 mol) of trimethylolpropane and 0.05 g of hydroquinone monomethyl ether in about 80 ml of THF was added dropwise. After the addition, the mixture was held at about 50° C. and reacted for about 5 hours, when a solution of 243.9 g (2.1 mol) of 2-hydroxyethyl acrylate in about 100 ml of THF was added thereto dropwise. The reaction liquid was stirred at 60° C. for additional 7 hours. After the reaction, a large amount of water was added to the reaction liquid, and the resultant precipitate was filtered out. The precipitate was composed of multi-components and purified by liquid chromatography to obtain urethane acrylate (3) represented by the following formula:

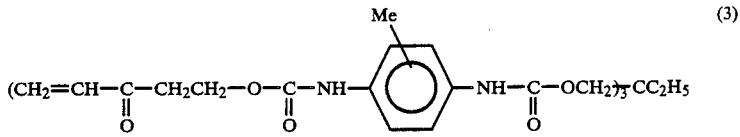

Figure 12:
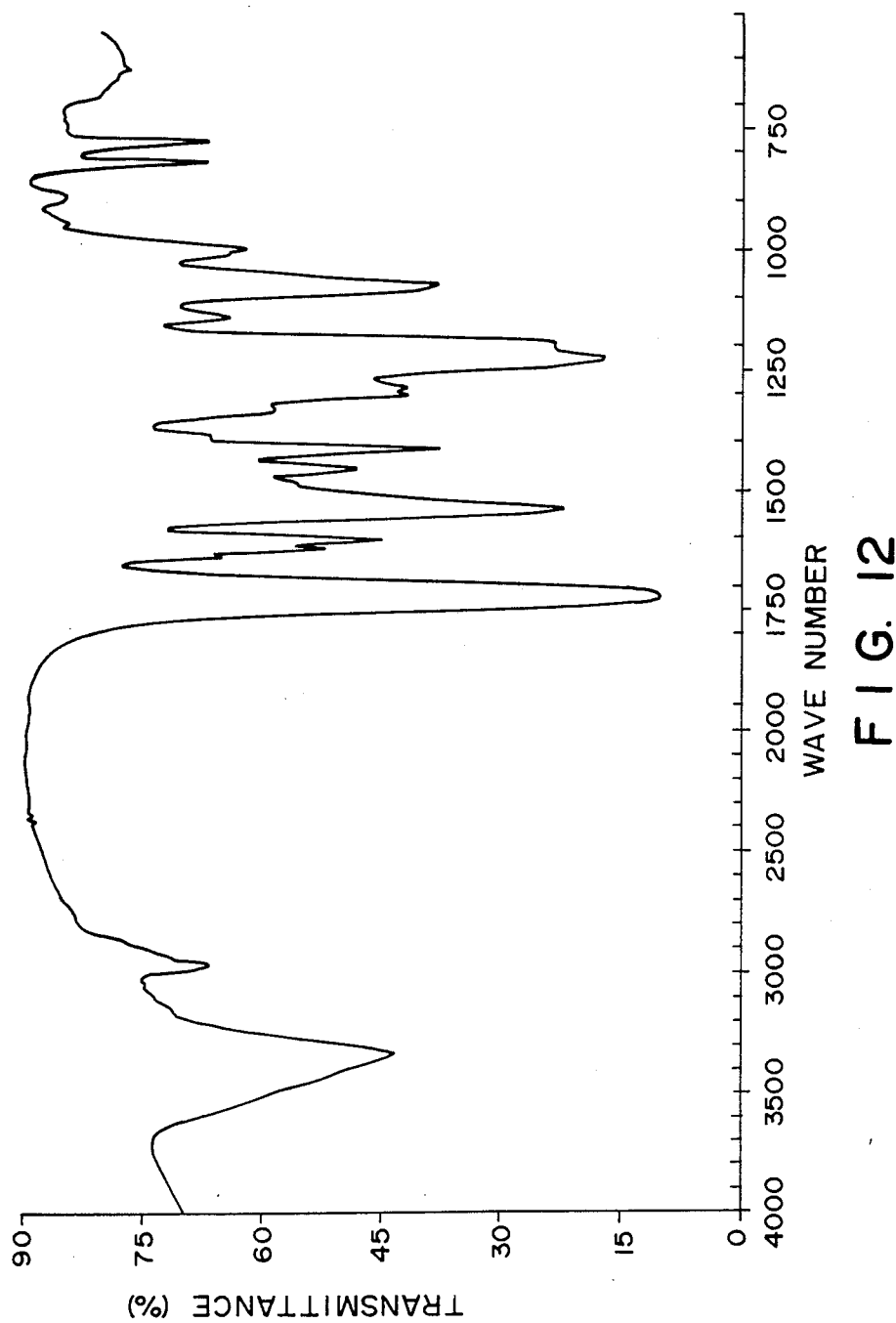

M.P. 60°–65° C. The IR chart is reproduced as FIG. 12.

SYNTHESIS EXAMPLE 5

[Urethane acrylate (4) synthesized through reaction of triisocyanate having an isocyanuric ring obtained by trimerization of hexamethylene diisocyanate and tolylene diisocyanate with 2-hydroxyethyl acrylate]

A triisocyanate having an isocyanuric ring obtained by trimerization of a mixture of hexamethylene diisocyanate: tolylene diisocyanate=2:3 (by mol) was used and reacted in the same manner as in Synthesis Example 2 to obtain urethane acrylate 4 represented by the following formula:

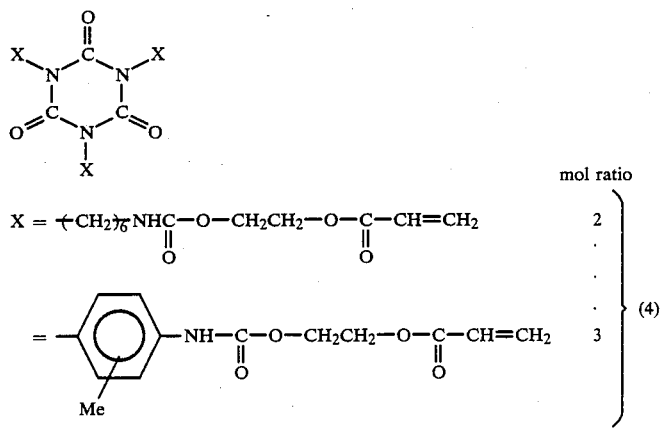

Figure 13:
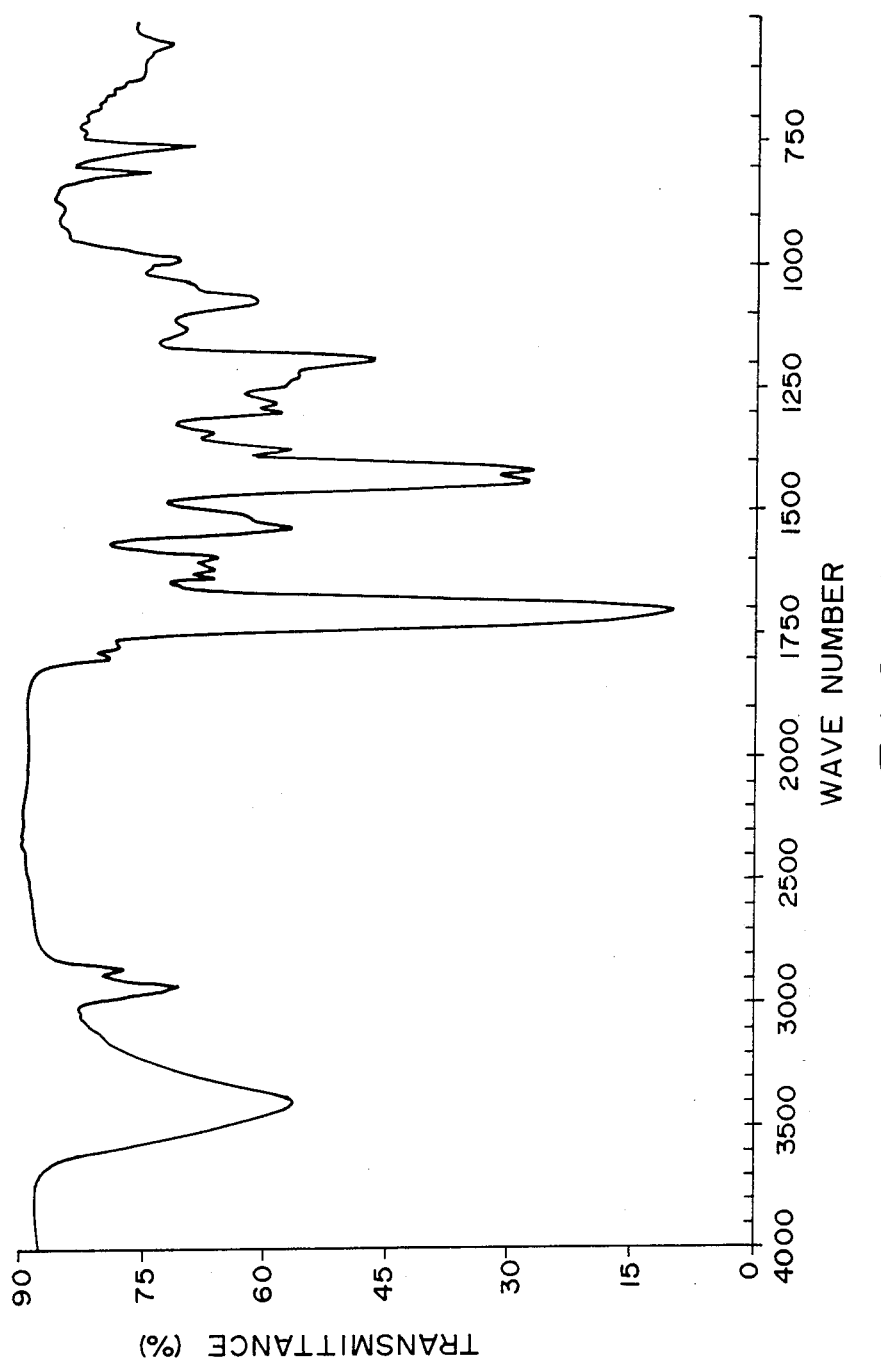

M.P.: 80°–85° C. The IR chart is reproduced as FIG. 13.

SYNTHESIS EXAMPLE 6

Urehtane acrylate (5) synthesized from 1,4-cyclohexylene diisocyanate and 2-hydroxypropyl acrylate]

Into a 5 l-four neck flask equipped with an air-introduction pipe, a thermometer, a cooling pipe and a stirrer, 4,500 g of 2-hydroxypropyl acrylate, 4.5 g of hydroquinone monomethyl ether and 0.5 g of dibutyltin dilaurate was added, and the system was heated to 55° C. Then, 900 g of trans-1,4-cyclohexane diisocyanate was added into the flask in 1 hour. While introducing air into the system, the reaction temperature was raised to 90° C., followed by reaction for about 5 hours. After the reaction, the reaction liquid was diluted with 5 l of acetone, and insoluble matter was removed therefrom by filtration under pressure. Into the remaining acetone solution, a large amount of water was added to obtain a white precipitate, which was then filtered out and dried to obtain urethane acrylate (5) represented by the following formula:

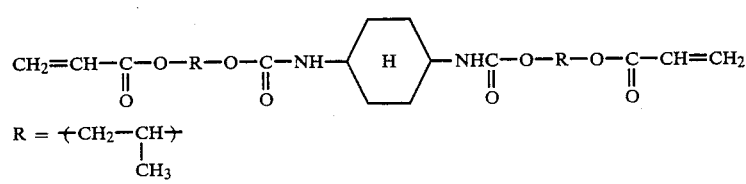

(5)

Figure 14:
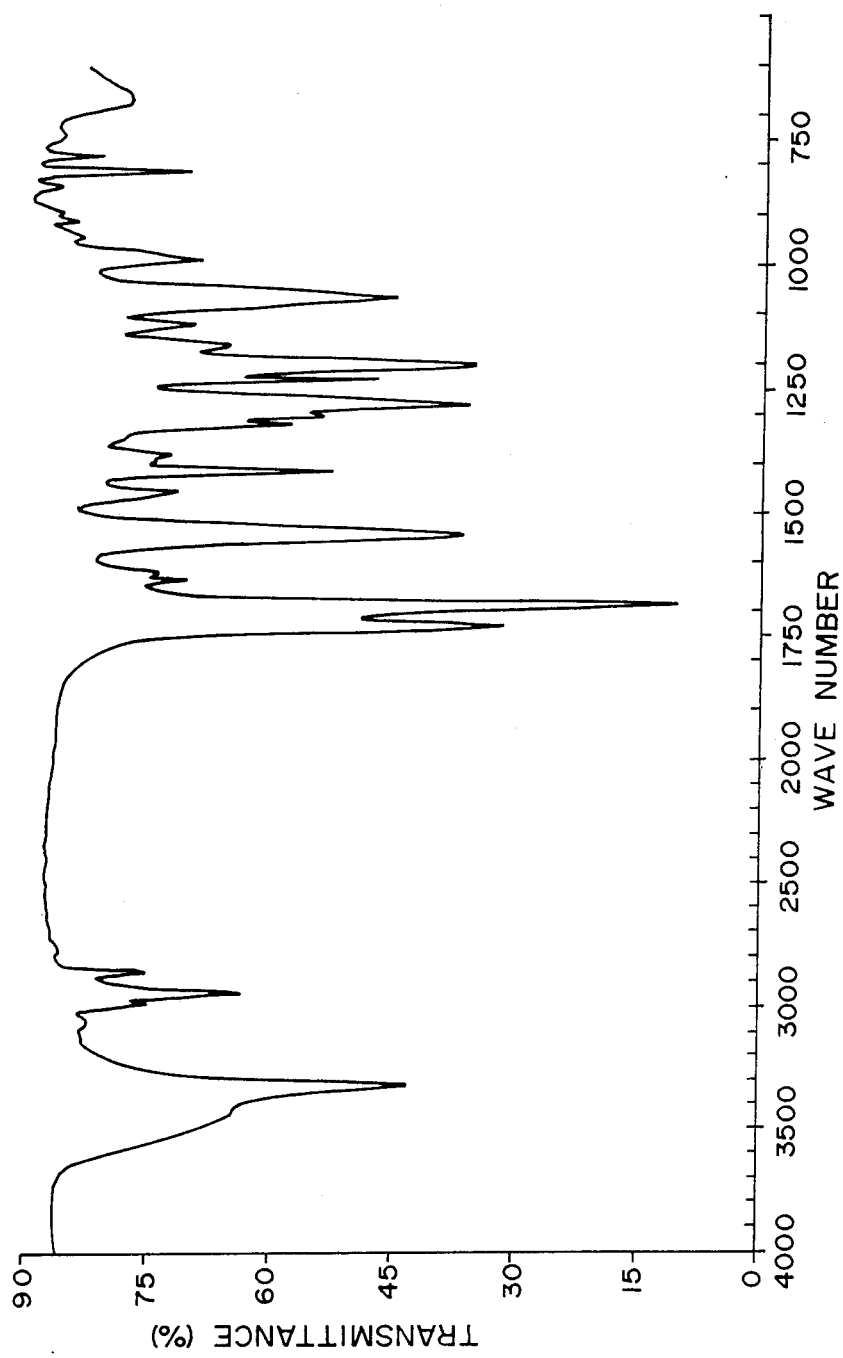

M.P.: 113°–115° C. IR chart: FIG. 14.

SYNTHESIS EXAMPLE 7

Urethane acrylate (6) synthesized from 4,4'-dicyclohexylmethane diisocyanate and 2-hydroxyethyl acrylate]

Into a 5 l-four neck flask equipped with an air-introduction pipe, a thermometer, a cooling pipe, a dropping funnel and a stirrer, 2227.0 g (8.5 mol) of dicyclohexylmethane diisocyanate and 0.4 g of dibutyltin dilaurate were charged, followed by heating to 70° C. Then, 2070.6 g (17.8 mol) of 2-hydroxyethyl acrylate with 4.2 g of hydroquinone monomethyl ether was added thereto dropwise in 1 hour from the dropping funnel. After the addition, the reaction temperature was raised to 90° C. while introducing air, followed by about 10 hours of reaction. After the reaction, yet-unreacted 2-hydroxyethyl acrylate was removed under reduced pressure to obtain urethane acrylate (6) represented by the following formula:

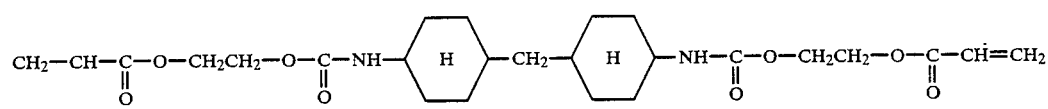

(6)

Figure 15:
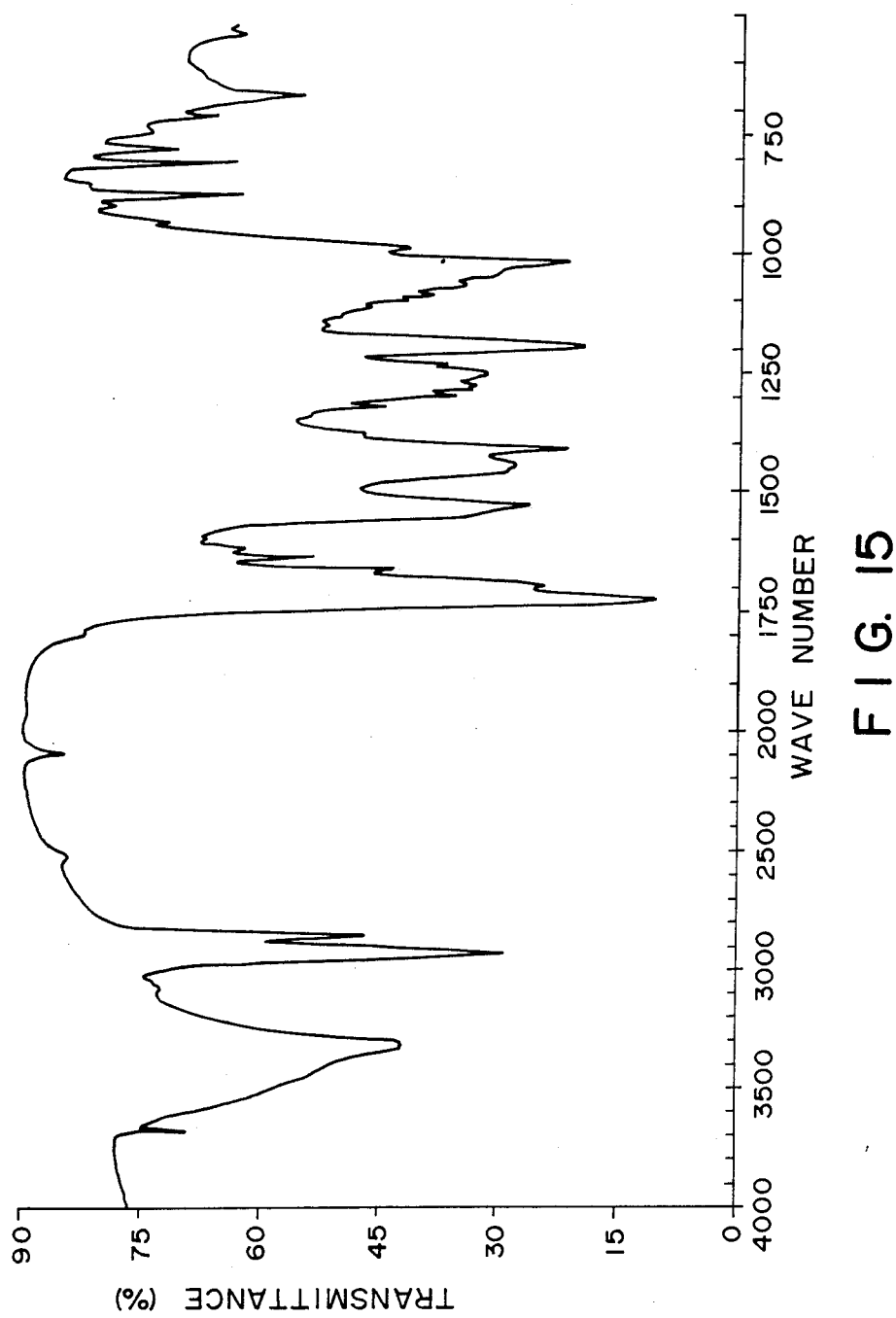

M.P.: 60°–63° C. IR chart: FIG. 15.

SYNTHESIS EXAMPLE 8

[Urethane acrylate (7) synthesized from 4,4'-dicyclohexylmethane diisocyanate, 2-hydroxyethyl acrylate and trimethylol propane]

Urethane acrylate (7) represented by the following formula was prepared in a similar manner as in Synthesis Example 4:

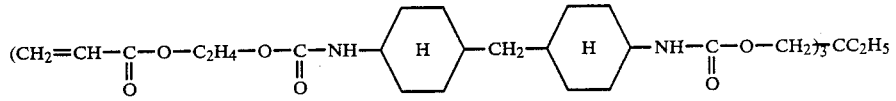

(7)

Figure 16:
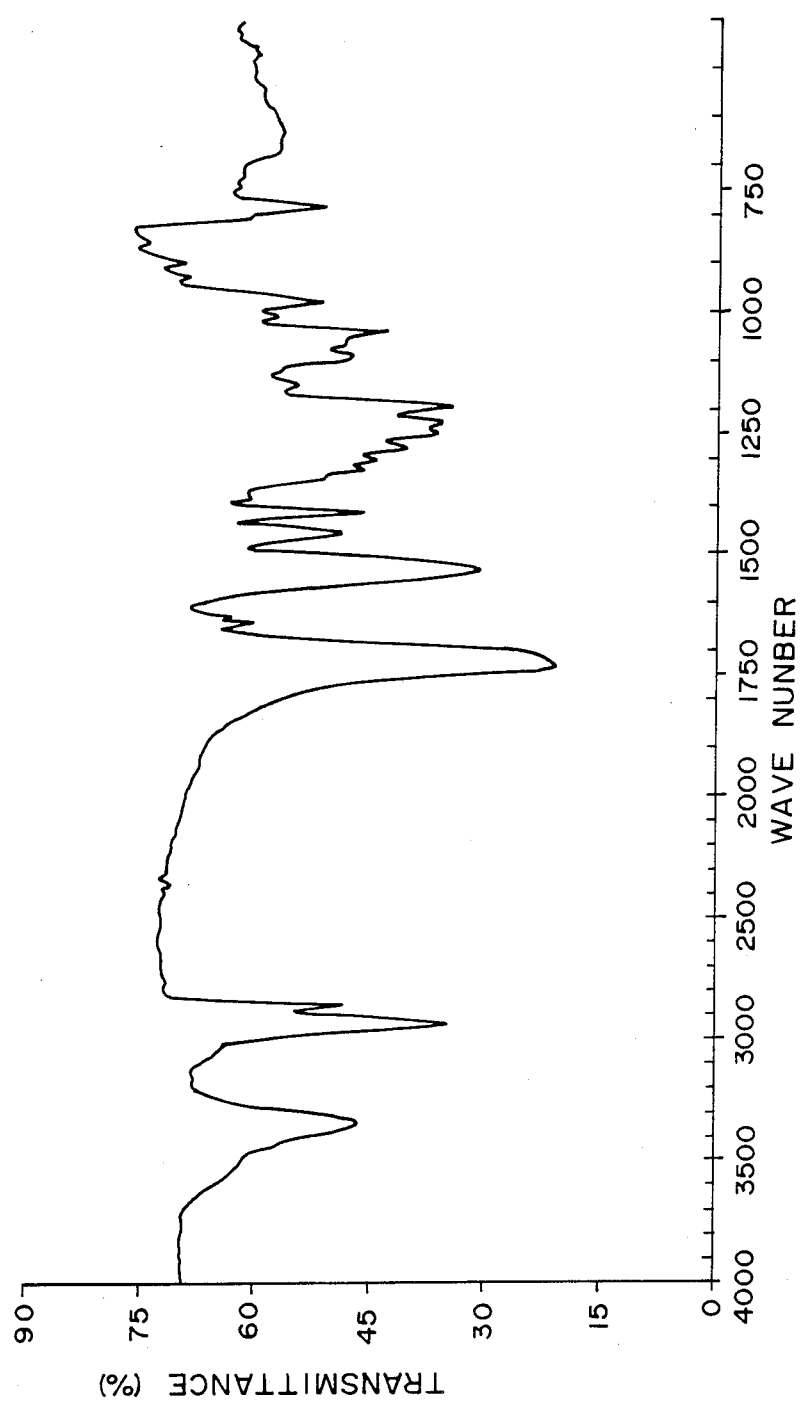

M.P.: 70°–75° C., IR chart: FIG. 16.

SYNTHESIS EXAMPLE 9

[Ester acrylate (8) synthesized from 1,4-cyclohexane diol and acrylic acid chloride]

57 g (0.5 mol) of 1,4-cyclohexane diol (mixture of cis and trans), 0.05 g of hydroquinone monomethyl ether and 60 g of pyridine were dissolved in about 800 ml of THF, and the solution was held at 10° C. Then, a solution of 120 g (1.33 mol) of acrylic acid chloride in about 100 ml of THF was added thereto dropwise. After the addition, the reaction solution was gradually restored to room temperature and then reacted for 3 hours at about 60° C.

A 10 wt.% aqueous solution of sodium hydroxide was added to decompose pyridine hydrochloride and then the solution was restored to neutrality, followed by addition of a large amount of water to obtain a white precipitate. The precipitate was filtered out and dried to obtain ester acrylate (8) represented by the following formula:

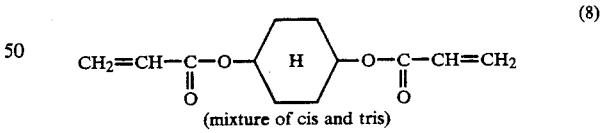

(8)

(mixture of cis and tris)

Figure 17:
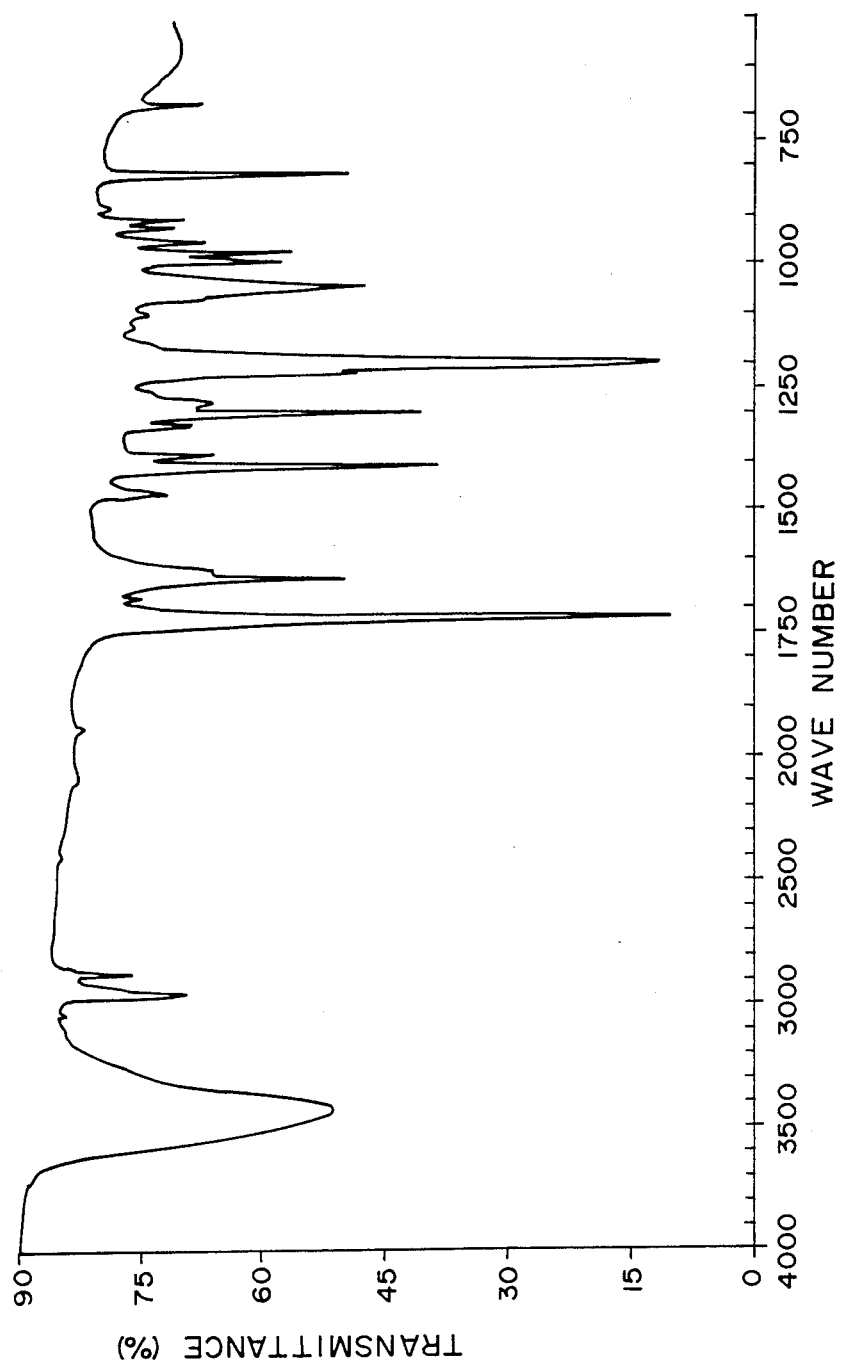

M.P.: 80°–89° C., IR chart: FIG. 17.

SYNTHESIS EXAMPLE 10

[Ester acrylate (9) synthesized from 1,4-cyclohexanedimethanol and acrylic acid chloride]

Ester acrylate (9) represented by the following formula was prepared in a similar manner as in

SYNTHESIS EXAMPLE 9:

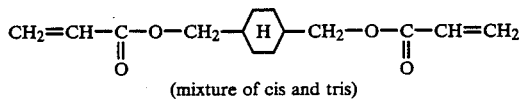

(9)

(mixture of cis and tris)

Figure 18:
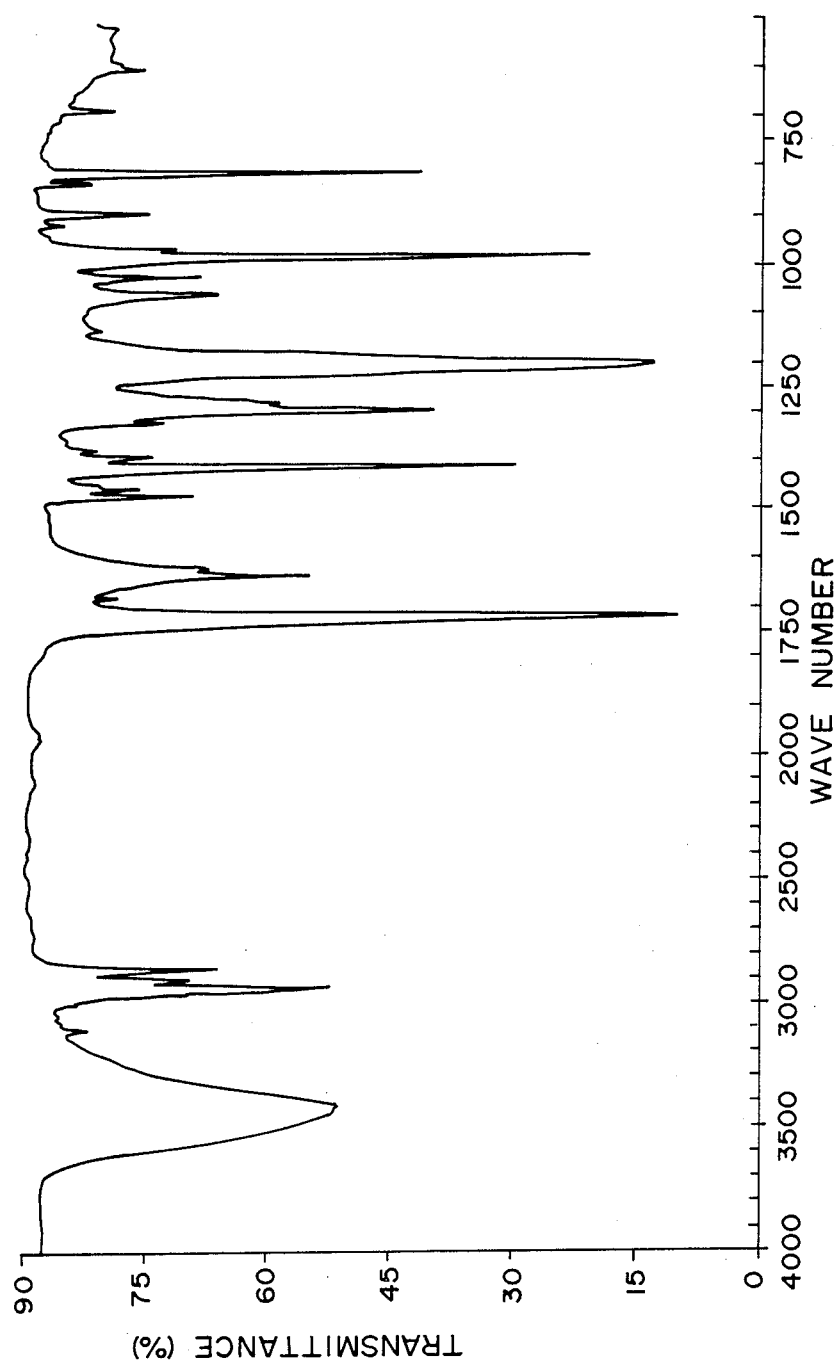

M.P.: 78°-82° C., IR chart: FIG. 18.

The photo-initiator may preferably be a radical initiator such as an azo compound, organic sulfur compound, carbonyl compound, or halogen compound. More specifically, examples of the photo-initiator may include: carbonyl compounds, such as benzophenone, benzyl, benzoin ethyl ether, and 4-N,N-dimethylamino-4'-methoxy-benzophenone; organic sulfur compounds, such as dibutyl sulfide, benzyl disulfide, and decyl phenyl sulfide; peroxides, such as di-tert-butyl peroxide, and benzoyl peroxide; halogen compounds, such as carbon tetrachloride, silver bromide, and 2-naphthalenesulfonyl chloride; and nitrogen compounds, such as azobisisobutylonitrile and benzenediazonium chloride.

The photo-initiator may further comprise p-nitroaniline, ethyl dimethylaminobenzoate 1,2-benzanthraquinone, 2,6-dinitroaniline, Michler's ketone, etc.

The transfer recording layer can further contain a binder component of a resin, wax, etc., in order to increase the mutual solubility of the photo-initiator and the polymerizing component and to improve the film-formability of the transfer recording layer.

Examples of the resin as the binder may include polyester resins, polyamide resins, polyurethane resins, polyurea resins, acrylic resins, styrene resins and vinyl resins such as vinyl chloride resins.

Further, examples of the wax as the binder may include: vegetable waxes, such as candelilla wax, carnauba wax and rice wax; animal waxes, such as bees wax, and whale wax; mineral waxes, such as ceresine, and montan wax; petroleum wax such as paraffin wax; and synthetic waxes, such as polyethylene wax, sasol wax, montan wax derivative, paraffin wax derivative, hardened castor oil, hardened castor oil derivative, fatty acids such as stearic acid, and fatty acid amides.

The coloring component or colorant contained in the transfer recording layer is a component to provide an optically recognizable image and may be appropriately selected from various pigments and dyes. Specific examples of the colorant include: inorganic pigments such as carbon black, lead yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

It is possible that the transfer recording layer further contains a stabilizer, such as hydroquinone, p-methoxyphenol, p-tert-butyl catechol, and 2,2'-methylene-bis(4-ethyl-6-tert-butylphenol).

The transfer recording layer may be formed as a single coating layer on a support, and it is also advantageous to cover the transfer recording layer with a film of polyethylene, polypropylene, etc., (in order to prevent a lowering in sensitivity due to inhibition) with oxygen in the atmosphere and then peel the film after the formation of transferable images. Further, if the composition constituting the transfer recording layer is formed into particulate image-forming elements and then coated with a polymer having a low oxygen permeability, the lowering in sensitivity can be prevented and the resolution of images can be improved.

Further, a transfer recording layer adapted to multi-color recording may be formed by using a plurality of recording compositions as described above containing mutually different colorants and photo-initiators having different absorption wavelength regions, microencapsulating the compositions respectively, and distributing the encapsulated compositions at random to be carried on the support.

Figure 5:
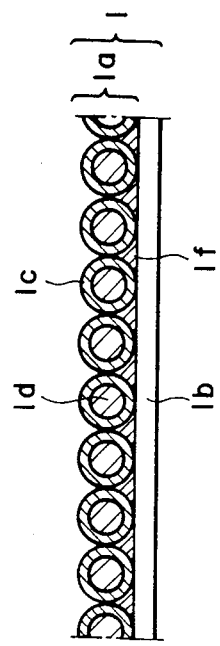
FIG. 5 is a schematic sectional view of a transfer recording medium for color-recording according to the present invention which comprises microcapsules containing a transfer recording material and carried on a support film.

More specifically, when image forming elements are in the form of microcapsules as shown in FIG. 5, the above mentioned compositions for the transfer recording layer are contained as cores $1d$ and encapsulated by a wall $1c$. On the other hand, the wall of the microcapsules may for example be formed of a material including gelatine, gum arabic, cellulosic resins such as ethyl cellulose, and nitrocellulose, polymers such as urea-formaldehyde resin, polyamides, polyesters, polyurethane, polycarbonate, maleic anhydride copolymers, polyvinylidene chloride, polyvinyl chloride, polyethylene, polystyrene, and polyethylene terephthalate.

The recording layer may preferably be formed in a thickness of 1-20 $\mu$, particularly 3-10 $\mu$. When the recording layer comprises particulate image forming elements including those in the form of microcapsules, it is preferred that the image forming elements have a particle size of 1-20 $\mu$, particularly 3-15 $\mu$. The forming elements may preferably have a particle size distribution in the range of within ±50 %, particularly within ±20 %, from the number-average particle size thereof. In case where the image forming elements are in the form of microcapsules, the shell thickness may preferably be 0.1-2.0 $\mu$, particularly 0.1-0.5 $\mu$.

Microencapsulation may be effected in any of the known methods, such as simple coacervation, complex coacervation, interfacial polymerization, in-situ polymerization, interfacial precipitation, phase separation, spray drying, gaseous-phase suspension coating, and mechano-chemical process.

In order to constitute the transfer recording medium according to the present invention into one adapted for use in multi-color image formation, the image forming elements containing different colorants may preferably have sensitivities to different wavelengths. As described hereinbefore, when the transfer recording layer is composed of a number (n) of colors of image forming elements, the image forming elements should preferably contain n types of functional components allotted to respective colors and each providing an abruptly changing reaction velocity when irradiated with a particular wavelength of light. These functional components in combination of n kinds are respectively contained in the image forming elements which are distributed to form a transfer recording layer. Examples of such a combination include, as a combination for a two-color recording system, one comprising:

a photo-initiator sensitive to about 400-500 nm, such as:

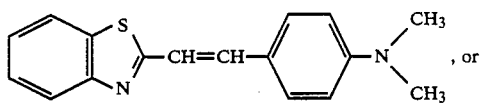

, or

-continued

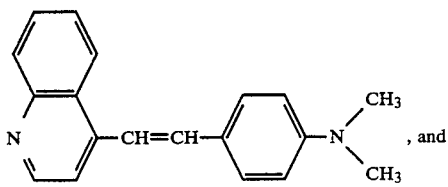
, and a photo-initiator sensitive to about 480–600 nm, such as:

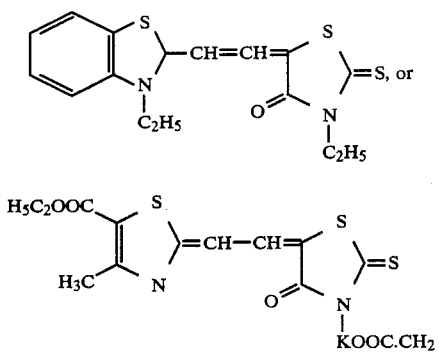

In this case, the sensitivity regions of the above two types of photo-initiators overlap each other in the region of 480–500 nm, but this is a low sensitivity region to both types of photo-initiators. Thus, they can be almost completely separated from each other, if necessary, by using appropriate light sources.

Sensitivity separation adapted for three color image forming element system may be provided by using an azo compound having a sensitivity to 340–400 nm or a halogen compound having a sensitivity to 300–400 nm in combination with the above photo-initiators, so that a full-color recording system may be developed.

Further, as a combination of photo-initiators, one of a 2-chlorothioxanthone/ethyl p-dimethylaminobenzoate, and b dichlorobenzophenone/ethyl p-dimethylaminobenzoate, may also be used. Light sources of α a fluorescent light having a peak wavelength of 390 nm and β a fluorescent light having a peak wavelength of 313 nm may be used in combination with the above combination of the photo-initiators. In order to provide the same degree of reaction (i.e., the same transfer density level), the required illumination energy level is assumed to be 1 (standard) for a combination a - α, 4 (times) for a - β, 1.1 for b - β, and 5 for b - α. As a result, if the light source α is used at the illumination energy level of 1 and the light source β is used at the illumination energy level of 1.1, the photoinitiator systems a and b can be separately activated so as to provide substantially the same reaction degree.

Further, even in a case where the functional components contained in the image forming elements have substantially the same spectral sensitivity or wavelength dependency, the respective image forming elements can have different spectral sensitivities due to different filter effects of colorants contained therein. For example, a blue colorant transmits and reflects wavelengths of about 400–500 nm for blue light and absorbs the region of 500–700 nm for green to red light. Accordingly, an image forming element containing a blue colorant has a sensitivity to blue light. For the same reason, an image forming element containing a red colorant has a sensitivity to red light. Thus, even if image forming elements contain a functional component sensitive to a blue-red spectral range, they can have separate sensitivities because of the colorants contained therein.

In the transfer recording medium used in the present invention, it is possible that the radical reactivity of the transfer recording layer is suppressed because of oxygen in the air. In order to obviate this difficulty, it is preferred to provide an oxygen-shielding layer by applying an aqueous polyvinyl alcohol solution containing a small amount of a surfactant on the transfer recording layer. The oxygen-shielding layer may be removed after the latent image formation by washing with water. In case of image forming elements in the form of microcapsules, it is possible to have the walls show a function of the oxygen-shielding layer.

The color transfer recording medium used in the present invention may for example be produced in the following manner.

The various components forming the transfer recording layer such as the functional component, binder component, stabilizer, colorant, etc., may be melt-mixed and coated on a substrate such as a polyimide film by means of an application, etc., to form a transfer recording medium. In case where the transfer recording layer is formed of image forming elements of multi-colors, for example, the above components may be mixed and formed into minute image forming elements by spray drying, etc., for respective colors, and the resultant image forming elements of respective colors are sufficiently mixed with a binder such as a polyester resin in a solvent such as methyl ethyl ketone and ethylene glycol diacetate and coated by a solvent-coating method onto a substrate such as a polyimide film, followed by drying, e.g., at 80° C. for 3 minutes to remove the solvent to form a transfer recording layer. Thus, a desired transfer recording medium may be obtained.

Alternatively, it is also possible to apply a coating binder of an adhesive such as that of polyvinyl alcohol (PVA), epoxy-type, polyvinylpyrrolidone, polyacrylamide, polyester-type, urethane resin-type, acrylic-type, urethane-acrylic-type, or ethylene-vinyl acetate copolymer-type, and then to distribute image forming elements on the coating binder layer. The binder may preferably be applied in a thickness of 0.1–1 μ.

In a case where the image forming elements are in the form of microcapsules, they may be bound to a substrate by a method similar to one as described above with reference to the minute or particulate image forming elements.

It is also possible to attach the particulate image forming elements onto the support electrostatically. In this case, the particulate image forming elements or the support or both may be corona-charged or triboelectrically charged, followed by attachment. It is further possible to provide the surfaces of the image forming elements and the support, respectively, with functional groups and then to chemically bind the image forming elements to the support.

The substrate or support to be used in the transfer recording medium according to the present invention is not particularly limited, but may be known material such as polyester, polycarbonate, triacetylcellulose, nylon, polyimide, polyethylene terephthalate, and aramide resin or a metal such as aluminum in the form of, e.g., a film, sheet, plate, drum or sphere.

The transfer recording layer may preferably comprise 0.1–10 wt.% of the colorant, 20–95 wt.% of the functional component including 0.001–20 wt.% of the photo-initiator, and 0–90 wt.% of the binder component, for example.

Hereinbelow, the present invention will be explained by way of Examples.

EXAMPLE 1

TABLE 1

| Category | Component | wt. % |
|---|---|---|
| Polymerizing component | Reaction product between bisphenol A-type epoxy resin (Epikote 1007, available from Yuka Shell Epoxy K.K.) and acrylic acid (M.P.: 60° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

The components shown in the above Table 1 were dissolved in dichloromethane solvent and applied in a thickness of 4 μm onto a 6 μm-thick polyethylene terephthalate (PET) film by solvent coating. The coating film was further coated with an aqueous solution of polyvinyl alcohol (PVA, Mn=1200) to form a 10 μm-thick oxygen-shielding layer, thereby to obtain a transfer recording medium according to the present invention, which is hereinafter sometimes referred to as a "sample".

The sample thus prepared was placed on a hot plate heated to a prescribed temperature and illuminated for a prescribed period with ultraviolet rays from a 2 KW-high-pressure mercury lamp disposed opposite to the sample. After the ultraviolet illumination, the sample was placed for 3 minutes on a hot plate at 100° C. so as to accelerate and uniformize the reaction, and then the PVA oxygen-shielding layer was removed by washing with water.

Then, plain paper having a surface smoothness of 10–30 was superposed on the transfer recording layer of the sample, and the resultant laminate was introduced into the separation-transfer unit of a recording apparatus as shown in FIG. 3A and conveyed between a heat roller 8 and a pinch roller 9. The heat roller 8 was an aluminum roller having a 300 W-heater inside thereof and covered with a 2 mm-thick silicone rubber layer. The surface temperature of the heat roller 8 was controlled at 30°–150° C. by the heater. The pinch roller 9 was one made of silicone rubber (having a hardness of 50° according to measurement by JIS rubber hardness meter) and controlled to exert a pressure of 1–1.5 kg/cm².

From the laminate sample thus treated, the support PET film was peeled off to examine whether or not the illuminated portion of the recording layer was transferred to the plain paper.

The above operation was repeated while changing the temperature at the time of illumination and the time for illumination variously, thereby to obtain a critical illumination time required to increase the transfer temperature of the illuminated portion to 150° C. or above. The results are summarized as a curve Ex. 1 in FIG. 9 in terms of a relation between the reciprocal of the illumination temperature (T) and the reciprocal of the above-mentioned critical illumination time ($t_{h\nu}$) for providing a transfer initiation temperature of 150° C. The reciprocal $(t_{h\nu})^{-1}$ of the critical illumination time is defined as "sensitivity".

Separately, the sample prepared in the above manner was wound up in a roll and set in the transfer image-formation unit of an apparatus as shown in FIG. 3A.

The thermal head 4 was one of a line type of 8 dots/mm - A4 size having a row of resistance heating elements at its edge portion. The thermal head 4 was disposed so as to contact the base film side of the transfer medium 1 and in such a manner that the transfer medium 1 was pressed to the heating elements due to a tension applied to the transfer medium. Opposite to the thermal head 4 was disposed a high pressure mercury lamp 3 of about 2 KW.

Then, the thermal head 4 was energized while being controlled based on image signals. In this example, the parts of the transfer recording layer 1a increased glass transition point to increase the transfer temperature, whereby a negative type of recording was effected. More specifically, the thermal head 4 was controlled in such a manner that it was not energized in response to a mark signal (black) but was energized in response to a non-mark signal (white) to generate heat at a current energy of 0.8 W/dot×25 msec. In this way, while effecting uniform illumination with a high pressure mercury lamp, the thermal head was driven under control based on image signals at a repetition cycle of 50 msec/line, in phase with which the transfer recording medium was conveyed by means of a stepping motor and a driving rubber roller.

Then, the PVA film was removed and the transfer recording medium was superposed on a transfer-receiving paper. The resultant laminate was then introduced into the separation-transfer unit of the apparatus shown in FIG. 3A and passed between the heating rollers, followed by separation of the PET support, whereby a high quality image was formed with a good fixation characteristic on the transfer-receiving paper.

EXAMPLE 2

TABLE 2

| Category | Component | wt. % |
|---|---|---|
| Polymerizing component | Reaction product between hydrogenated bisphenol A-type epoxy resin (Hydrogenation product of Epikote 1007, available from Yuka Shell Epoxy K.K.) and acrylic acid (M.P.: 60° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

Figure 4:
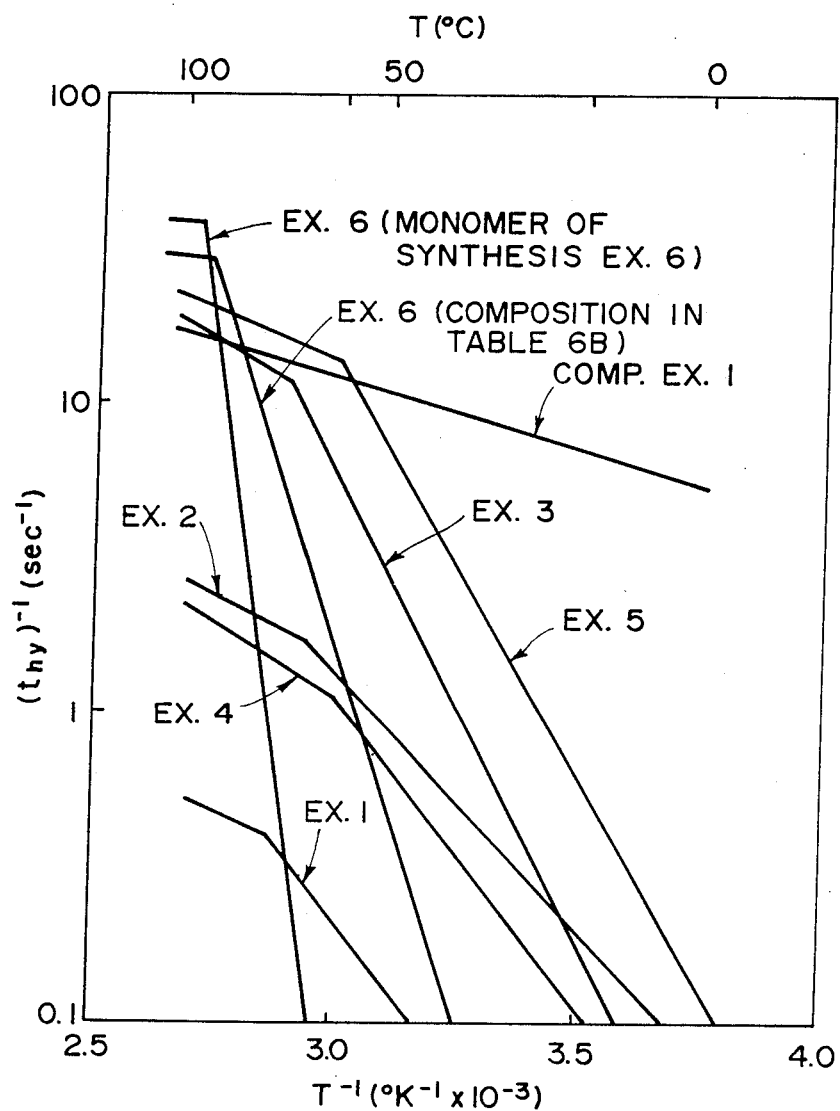
FIG. 4 is a graph showing a relation between the reciprocal of temperature of a transfer recording medium at the time of illumination and the reciprocal of light quantity required for providing a transfer temperature of 150° C. or higher to the transfer recording medium.

A sample was prepared in the same manner as in Example 1 except for using the components shown in above Table 2. The sample was evaluated with respect to the relation between the reciprocal of the illumination temperature and the sensitivity. The results are also shown in FIG. 4 as Ex. 2, representing good heat- or temperature-dependency of the sensitivity. The sample of this Example was also satisfactory in image-formation in the same manner as in Example 1.

EXAMPLE 3

TABLE 3

| Category | Component | wt. % |
|---|---|---|
| Polymerizing component | Tris(2-methacryloxyethyl) isocyanurate (FA-731M, from Hitachi Kasei K.K.; M.P.: 80° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in above Table 3. The sample was evaluated with respect to the relation between the reciprocal of the illumination temperature and the sensitivity. The results are also shown in FIG. 4 as Ex. 3, representing good heat- or temperature-dependency of the sensitivity. The sample of this Example was also satisfactory in image-formation in the same manner as in Example 1.

EXAMPLE 4

TABLE 4

| Category | Component | wt. % |
|---|---|---|
| Polymerizing component | Reaction product between 4,4'-diphenylmethane diisocyanate and 2-hydroxyethyl acrylate (Urethane acrylate (2) of Synthesis Example 3) (M.P.: 88–90° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in above Table 4. The sample was evaluated with respect to the relation between the reciprocal of the illumination temperature and the sensitivity. The results are also shown in FIG. 4 as Ex. 4, representing good heat- or temperature-dependency of the sensitivity. The sample of this Example was also satisfactory in image-formation in the same manner as in Example 1.

EXAMPLE 5

TABLE 5

| Category | Component | wt. % |
|---|---|---|
| Polymerizing component | Reaction product between 4,4'-dicyclohexylmethane diisocyanate (Desmodur W, from Sumitomo Bayer Urethane K.K.) and 2-hydroxyethyl acrylate (Urethane acrylate (6) in Synthesis Example 7) (M.P.: 60–63° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K ) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in above Table 5. The sample was evaluated with respect to the relation between the reciprocal of the illumination temperature and the sensitivity. The results are also shown in FIG. 4 as Ex. 5, representing good heat- or temperature-dependency of the sensitivity. The sample of this Example was also satisfactory in image-formation in the same manner as in Example 1.

As shown in FIG. 4, the transfer recording media of Examples 1–5 of the present invention showed a low sensitivity to illumination under no heating but showed a high sensitivity illumination under heating, and the sensitivity characteristics changed remarkably around the melting points of the polymerizing components. Thus, it has been shown that the transfer recording layer according to the present invention provides remarkably different transfer characteristics even when illuminated with the same quantity of light whether or not it is also provided with heat energy.

EXAMPLE 6

Samples were prepared in the same manner as in Example 1 that the polymerizing component among the components shown in Table 1 was represented by those shown in the following Table 6A. The obtaned samples were subjected to image formation in the same manner as in Example 1 except that the period of current application to the thermal head (TPH) and the repetition cycle were changed from 25 msec and 50 msec, respectively, to those shown in the following Table 6A, whereby good images were obtained.

TABLE 6A

| Polymerizing component | | | Time for current supply | Repetition cycle |
|---|---|---|---|---|
| Name | Number of Synthesis Example | Melting point (°C.) | to thermal head (msec) | (msec) |
| Urethane acrylate (1) | 2 | 120–125 | 16 | 50 |
| Urethane acrylate (3) | 4 | 60–65 | 20 | 50 |
| Urethane acrylate (4) | 5 | 80–85 | 15 | 50 |
| Urethane acrylate (5) | 6 | 113–115 | 5 | 15 |
| Urethane acrylate (7) | 8 | 70–75 | 9 | 25 |
| Ester acrylate (8) | 9 | 80–89 | 9 | 25 |
| Ester acrylate (9) | 10 | 78–82 | 10 | 25 |
| VAS-10, from Sanyo Kokusaku Pulp K.K. | | 80 | 18 | 50 |

As will be understood from the image forming conditions shown in the above Table 6A in connection with the description of the respective Synthesis Examples, polymerizing components containing a cyclohexane ring or isocyanuric ring (triazine ring), particularly a cyclohexane ring, provide a particularly high sensitivity so that image formation is effected with a small heat energy from the thermal head. Thus, transfer recording media having a high recording speed, i.e., a short repetition cycle, are provided.

The relation between the illumination temperature and the sensitivity were examined in the same manner as in Example 1 with respect to the sample obtained by using the composition including the urethane acrylate (5) of Synthesis Example 6 and a sample obtained by using a composition shown in the following Table 6B. The results are also shown in FIG. 4.

TABLE 6B

| Category | Component | wt. % |
| --- | --- | --- |
| Polymerizing component | Urethane acrylate (5) (of Synthesis Example 6) | 89 |
| Photo-initiator | 2-Chlorothioxanthone (Tokyo Kasei K.K.) | 1.5 |
|  | Ethyl dimethylaminobenzoate (Tokyo Kasei K.K.) | 2.5 |
| Colorant | Carbon black | 7 |

EXAMPLE 7

TABLE 7

| Category | Component | wt. % |
| --- | --- | --- |
| Polymerizing component | Reaction product between dicyclohexylmethane diisocyanate and 2-hydroxyethyl acrylate (Urethane acrylate (6) of Synthesis Example 7) (M.P.: 60-63° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
|  | Ethyl dimethylminobenzoate (Tokyo Kasei K.K.) | 2 |
| Colorant | Diaresin Red K (Mitsubishi Kasei Kogyo K.K.) | 7 |

TABLE 8

| Category | Component | wt. % |
| --- | --- | --- |
| Polymerizing component | Reaction product between dicyclohexylmethane diisocyanate and 2-hydroxyethyl acrylate (Urethane acrylate (6) of Synthesis Example 7) (M.P.: 60-63° C.) | 67 |
| Binder component | Polymethyl methacrylate (PMMA) (Elvasite 2041, from E. I. Du Pont) | 23 |
| Photo-initiator | 4,4-Dichlorobenzophenone (Tokyo Kasei K.K.) | 1 |
|  | Ethyl dimethylaminobenzoate (Tokyo Kasei K.K.) | 2 |
| Colorant | Diaresin Yellow HG (Mitsubishi Kasei Kogyo K.K.) | 7 |

The compositions shown in the above Tables 7 and 8 were respectively microencapsulated in the following manner.

Each of the compositions shown in Tables 7 and 8 in a quantity of 10 parts was mixed with 20 parts of methylene chloride. The mixture was mixed with a solution of a cationic or nonionic surfactant having an HLB value of at least 10 and 1 g of gelatine in 200 ml of water, and the resultant mixture was stirred by means of a homomixer at an elevated temperature of 60° C. to form an emulsion containing oil droplets with an average particle size of 26 μm.

The emulsion was further stirred at 60° C. for 30 min. to evaporate the methylene chloride to provide an average particle size of 10 μm. A solution 1 g of gum arabic in 20 ml of water was added thereto, and the system was gradually cooled with addition of an NH$_4$OH aqueous solution (ammoniacal water) to a pH of above 11, thereby form a slurry of microcapsules. Then, 1.0 ml of a 20 % aqueous solution of glutaraldehyde was slowly added to harden the capsule walls.

Then, the slurry was subjected to solid-liquid separation by a Nutsche funnel to recover the capsules, which were then dried under vacuum at 35° C. for 10 hours to obtain image forming elements in the form of microcapsules.

The thus prepared two type of image forming elements each having an average particle size of 10 μm were mixed in equal amounts.

Separately, a 6 μm-thick polyethylene terephthalate film 1b was coated with a 5 % aqueous solution of polyvinyl alcohol as an adhesive to which a surfactant had been added in a proportion of several drops per 100 cc. Then, the above prepared mixture of image forming elements were dispersed on the support 1 coated with the adhesive 1f as shown in FIG. 5 and dried in 1 hour in an environment of 80° C. to form a transfer recording layer 1a, thereby to obtain a sample of the transfer recording medium 1.

Figure 3B:
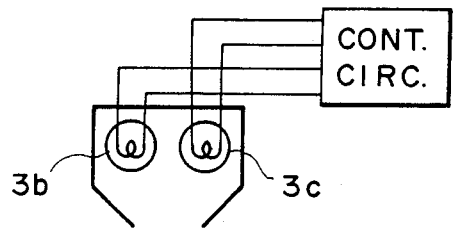

The transfer recording medium thus prepared was wound up in a roll and set in an apparatus as shown in FIG. 3A. In the apparatus shown in FIG. 3A, the light source 3 included a fluorescent lamp 3c having a spectral peak wavelength of 335 nm (FL. 10A70E35, mfd. by Toshiba K.K.) and a fluorescent lamp 3b having a spectral peak wavelength of 390 nm (FL. 10A70E39, mfd. by Toshiba K.K.) corresponding to the spectral absorption characteristics of the two types of image forming elements as shown in FIG. 3B. The lamps 3b and 3c were disposed in parallel so as to illuminate the sample surface through a 1 mm-wide slit respectively.

Figure 6:
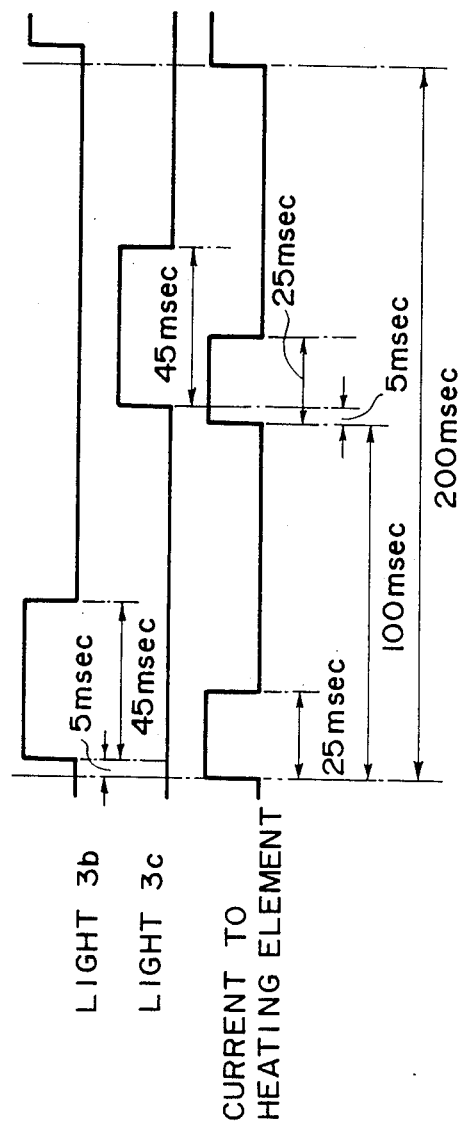
FIG. 6 is a timing chart for signals supplied to a thermal head and fluorescent lamps for two-color recording in Example 7.

The transfer recording layer 1a had a property of increasing its softening temperature to lose a transferability to the record paper 10 when it was provided with light rays a prescribed wavelength range and heat. For this reason, as shown in the timing chart of FIG. 6, for the purpose of red color recording, a current was supplied for 25 msec not to heating elements corresponding to an image signal of "red" but to heating elements corresponding to an image signal of "white" (the color of the paper 10), and the fluorescent lamp 3b was turned on with a time lag of 5 msec to effect uniform illumination. The illumination time at this time was 45 msec.

Next, for yellow color recording, from a point of time 50 msec after the termination of the above illumination, i.e., from the point 100 msec after the commencement of the energization of the heating elements, a current was supplied for 25 msec not to heating elements corresponding to an image signal of "yellow" but to heating elements corresponding to an image signal of "white", and the fluorescent lamp 3c was turned on 5 msec thereafter to effect uniform illumination. The illumination time was equally 45 msec.

In the above described manner, the thermal head 4 was energized under control based on image signals of yellow, red and white to form a negative image in the transfer recording layer, while the transfer recording medium 1 was conveyed in synchronism with the operation in a repetition cycle of 200 msec/ line. After the above-mentioned image was formed in this way, the transfer recording medium 1 was sent to the transfer section, where a recording paper 10 was superposed onto the image bearing face of the transfer medium, and after heating under pressure, the transfer medium was separated to leave a transferred image of two colors of yellow and red on the recording paper 10. Thus, two-color recording was effected in one shot.

Figure 8:
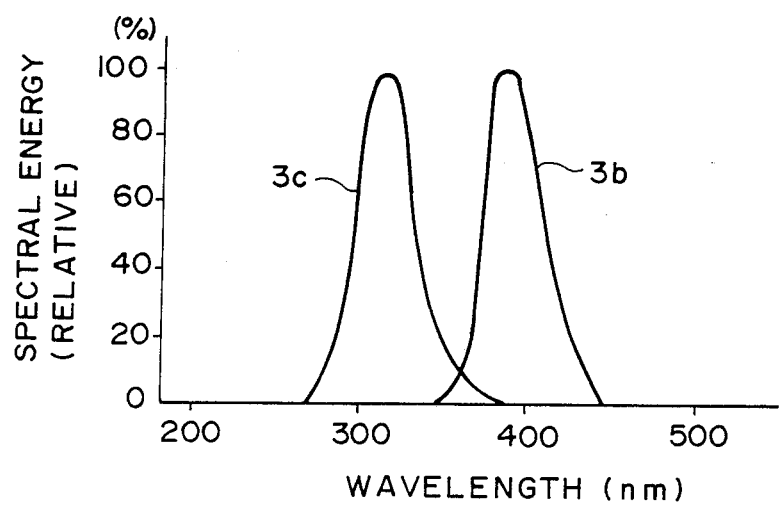
FIG. 8 shows spectral energies of two fluorescent lamps used as light sources corresponding to two kinds of image forming elements in Example 7.

FIG. 7 shows an absorption spectrum A of the photoinitiator given in Table 7 and an absorption spectrum B of the photoinitiator given in Table 4. FIG. 8 shows the spectral energy distributions of the two types of fluorescent lamps used in this Example.

EXAMPLE 8

TABLE 9

| Category | Component | wt. % |
|---|---|---|
| Polymerizing component | Aronix M-315 (available from Toa Gosei Kagaku K.K.; M.P.: 30–40° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the above composition. This sample and the sample obtained in Example 3 were respectively stored for 3 months under the environmental conditions of a temperature 40° C. and a humidity of 85 %. The samples thus stored were then respectively introduced into the apparatus shown in FIG. 3A and subjected to image formation in the same manner as in Example 1.

Both samples provided good images when used immediately after the preparation. However, the sample prepared by using the composition shown in Table 9 provided images with some degree of white dropping when used after the above storage for 3 months under 40° C. and 85 %. On the other hand, the sample prepared by using the composition shown in Table 3 provided images which were completely free of white dropping.

COMPARATIVE EXAMPLE 1

TABLE 10

| Category | Component | wt. % |
|---|---|---|
| Polymerizing component | Aronix-400 (from Toa Gosei Kagaku. Liquid at 25° C.) [(CH$_2$ = CH — COOCH$_2$)$_3$C]$_2$O | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |
| Colorant | Carbon black | 7 |

A sample was prepared in the same manner as in Example 1 except for using the components shown in above Table 10. The sample was evaluated with respect to the relation between the reciprocal of the illumination temperature and the sensitivity. The results are also shown in FIG. 4 as Comparative Example 1. The sample showed a high sensitivity to illumination even at a low illumination temperature, so that many white dropping portions occurred as a result of image formation in the same manner as in Example 1. Further, the transferred image retained tackiness, so that it was disturbed by rubbing with fingers.

COMPARATIVE EXAMPLE 2

TABLE 11

| Category | Component | wt. % |
|---|---|---|
| Polymerizing component | Reaction product between 1,4-cyclohexylene diisocyanate and 2-hydroxyethyl acrylate (M.P.: 160° C.) | 67 |
| Binder component | Polymethyl methacrylate (PMMA) (Elvasite 2041, from E. I. Du Pont) | 23 |
| Photo-initiator | 2-Chlorothioxanthone (Tokyo Kasei K.K.) | 1 |
| | Ethyl dimethylaminobenzoate (Tokyo Kasei K.K.) | 2 |

A sample was prepared in the same manner as in Example 1 by using the components shown in above Table 11 and using a 6 μm-thick aramide film support. This sample was introduced into the apparatus shown in FIG. 3A and subjected to image formation in a similar manner as in Example 1. In this case, however, the thermal head was energized so as to heat the transfer recording layer up to 160° C. As a result, the transfer recording layer caused thermal polymerization so that it could be transferred even without illumination.

As described above, in the transfer recording medium according to the present invention, the recording layer changes its transferability only when light and heat energies are provided in combination. For this reason, the transfer recording medium of the present invention retains a high environmental stability in comparison with a conventional transfer recording medium which utilizes only a heat energy and is affected by an environmental temperature and another conventional transfer recording medium which causes a change in characteristic with only light energy. As a result, the recording medium of the present invention can stably provide high quality of fine images. Further, the transfer recording layer of the transfer recording medium according to the present invention is solid at a temperature in the apparatus, so that it has a long pot life even if a polymerizing component with a high reactivity is used. The transferred image formed by using the transfer recording medium of the present invention has advantages of freeness from monomer odor and good weatherability in spite of the fact that it contains a polymerizing component. Thus, the transfer recording medium of the present invention using a polymerizing component having a melting point of 40°–150° C. provides recorded images with a good contrast and is excellent in storability.

What is claimed is:

1. A transfer recording medium comprising a support and a transfer recording layer formed thereon, said transfer recording layer irreversibly changing its transferability when simultaneously provided with light and heat energy, the transfer recording layer comprising a colorant and a functional component sensitive to said light and heat energy, the functional component comprising (i) a photoinitiator and (ii) a polymerizing component selected from the group consisting of a monomer, oligomer and prepolymer having an unsaturated double bond, wherein the polymerizing component is solid at room temperature and has a melting point of 40°–150° C.

2. A transfer recording medium according to claim 1, wherein the polymerizing component has a melting point of 60°–130° C.

3. A transfer recording medium according to claim 1, wherein said polymerizing component has a urethane or ester bond.

4. A transfer recording medium according to claim 1, wherein said polymerizing component has a cyclohexane or isocyanuric ring.

5. A transfer recording medium according to claim 1, wherein said transfer recording layer comprises a distributed layer of image forming elements each comprising the colorant and the functional component.

6. A transfer recording medium according to claim 5, wherein said transfer recording layer comprises plural kinds of image forming elements containing different photo-initiators having mutually different sensitive wavelength regions.

7. A transfer recording medium according to claim 1, wherein said transfer recording layer comprises a distributed layer of microcapsules each having a core comprising the colorant, and the functional component.

8. A transfer recording medium according to claim 7, wherein said transfer recording layer comprises plural kinds of microcapsules containing different photo-initiators having mutually different sensitive wavelength regions.

* * * * *

UNITED STATES PATENT AND TRADEMARK OFFICE
CERTIFICATE OF CORRECTION

PATENT NO. : 4,977,058

DATED : December 11, 1990

INVENTOR(S) : Masashi Miyagawa et al.

It is certified that error appears in the above-identified patent and that said Letters Patent is hereby corrected as shown below:

COLUMN 3:

Line 32, "out" should read --our--.

COLUMN 5:

Line 12, "0- $t_3$" should read --0 - $t_3$--.

COLUMN 6:

Line 67, "exaplined" should read --explained--.

COLUMN 7:

Line 63, "transferreceiving" should read --transfer-receiving--.

COLUMN 9:

Line 29, "raltes" should read --rates--.

UNITED STATES PATENT AND TRADEMARK OFFICE
CERTIFICATE OF CORRECTION

PATENT NO. : 4,977,058
DATED : December 11, 1990
INVENTOR(S) : Masashi Miyagawa et al.

It is certified that error appears in the above-identified patent and that said Letters Patent is hereby corrected as shown below:

COLUMN 13:

Line 2, "be" should be deleted.

Line 40, "Urethane" should read --[Urethane--.

COLUMN 15:

Line 3, "Urethane" should read --[Urethane--.

Line 43, "Urethane" should read --[Urethane--.

COLUMN 19:

Line 41, "a" should read --ⓐ--.

Line 42, "b" should read --ⓑ--.

Line 44, "α" should read --ⓐ--.

Line 45, "ß" should read --ⓑ--.

Line 50, "combination a" should read --combination ⓐ--.

UNITED STATES PATENT AND TRADEMARK OFFICE
CERTIFICATE OF CORRECTION

PATENT NO. : 4,977,058 Page 3 of 4

DATED : December 11, 1990

INVENTOR(S) : Masashi Miyagawa et al.

It is certified that error appears in the above-identified patent and that said Letters Patent is hereby corrected as shown below:

Line 51, "α," should read --(α),--; and "a - ß, 1.1 for b - ß," should read --(a)-(ß), 1.1 for (b)-(ß), --.

Line 52, "b - α." should read --(b) - (α).--; and "light source α" should read --light source (α)--.

Line 54, "ß" should read --(ß)--.

Line 55, "photoinitiator systems a and b" should read --photo-initiator systems (a) and (b) --.

COLUMN 21:

Line 13, "eposy resin" should read --epoxy resin--.

COLUMN 24:

Line 44, "obtaned" should read --obtained--.

COLUMN 25:

Line 38, dimethylminobenzoate" should read --dimethylaminobenzoate--.

UNITED STATES PATENT AND TRADEMARK OFFICE
CERTIFICATE OF CORRECTION

PATENT NO. : 4,977,058

DATED : December 11, 1990

INVENTOR(S) : Masashi Miyagawa et al.

It is certified that error appears in the above-identified patent and that said Letters Patent is hereby corrected as shown below:

COLUMN 27:

Line 13, "photoinitiator" should read --photo-initiator--.

COLUMN 28:

Line 66, "photoinitiator" should read --photo-initiator--.

Signed and Sealed this

Twenty-eighth Day of July, 1998

Attest:

BRUCE LEHMAN

*Attesting Officer*      *Commissioner of Patents and Trademarks*